United States Patent
Nabeta

(10) Patent No.: US 10,028,361 B2
(45) Date of Patent: Jul. 17, 2018

(54) EVALUATION METHOD, EVALUATION DEVICE, EVALUATION PROGRAM, RECORDING MEDIUM, AND MANUFACTURING METHOD FOR ORGANIC ELECTROLUMINESCENCE ELEMENT

(71) Applicant: Konica Minolta, Inc., Tokyo (JP)

(72) Inventor: Hiroyuki Nabeta, Tokyo (JP)

(73) Assignee: Konica Minolta, Inc., Tokyo (JP)

( * ) Notice: Subject to any disclaimer, the term of this patent is extended or adjusted under 35 U.S.C. 154(b) by 956 days.

(21) Appl. No.: 14/374,011

(22) PCT Filed: Dec. 6, 2012

(86) PCT No.: PCT/JP2012/081595
§ 371 (c)(1),
(2) Date: Jul. 23, 2014

(87) PCT Pub. No.: WO2013/111459
PCT Pub. Date: Aug. 1, 2013

(65) Prior Publication Data
US 2015/0039251 A1 Feb. 5, 2015

(30) Foreign Application Priority Data
Jan. 25, 2012 (JP) ................................. 2012-012658

(51) Int. Cl.
*G01R 27/26* (2006.01)
*G01R 31/44* (2006.01)
(Continued)

(52) U.S. Cl.
CPC .......... *H05B 37/03* (2013.01); *G01R 27/2605* (2013.01); *G01R 31/44* (2013.01); *H01L 51/0031* (2013.01)

(58) Field of Classification Search
CPC .. G01R 27/2605; G01R 31/44; G01R 13/402; G01R 13/36; G01R 13/42; H01L 51/0031; H01L 51/50
See application file for complete search history.

(56) References Cited

U.S. PATENT DOCUMENTS

| 5,793,640 A | * | 8/1998 | Wu | G01R 27/2605 324/600 |
| 8,076,842 B2 | * | 12/2011 | Gong | H01L 51/0003 257/40 |

(Continued)

FOREIGN PATENT DOCUMENTS

| JP | 2004-192925 A | 7/2004 |
| JP | 2010-217848 A | 9/2010 |

(Continued)

OTHER PUBLICATIONS

Ershov et al., "Negative capacitance effect in semiconductor devices," IEEE Transactions on Electron Devices (Nov. 1998) (available at: https://www.researchgate.net/publication/3063297).*

(Continued)

*Primary Examiner* — Patrick King
(74) *Attorney, Agent, or Firm* — Osha Liang LLP

(57) ABSTRACT

A method of evaluating an organic electroluminescence element which includes at least a light emitting layer between an anode and a cathode and has a light emitting element area of not less than 100 $mm^2$ and not more than 1 $m^2$. The method includes the steps of: applying a direct-current voltage not less than a light emission start voltage to the organic electroluminescence element and measuring an impedance spectrum of the organic electroluminescence element; calculating a capacitance from the impedance spectrum; and determining whether a value of the capacitance is positive or negative.

6 Claims, 12 Drawing Sheets

(51) Int. Cl.
*H05B 37/03* (2006.01)
*H01L 51/00* (2006.01)

(56) References Cited

U.S. PATENT DOCUMENTS

| | | | | |
|---|---|---|---|---|
| 2010/0066375 A1* | 3/2010 | Hente | ............... | G01R 31/2635 324/414 |
| 2011/0133769 A1* | 6/2011 | Chen | ............... | G01R 31/2635 324/762.07 |
| 2013/0324909 A1* | 12/2013 | Aydt | ............... | A61F 9/00834 604/20 |

FOREIGN PATENT DOCUMENTS

| | | | | | |
|---|---|---|---|---|---|
| JP | | 2010-272286 | A | | 12/2010 |
| JP | | 2011-34805 | A | | 2/2011 |
| JP | | 2011-34811 | A | | 2/2011 |
| JP | | 2011034805 | A | * | 2/2011 |
| JP | | 2011034811 | A | * | 2/2011 |
| WO | WO 2012171531 | A1 | * | 12/2012 | ............. G01R 31/44 |

OTHER PUBLICATIONS

International Preliminary Report on Patentability issued in corresponding International Application No. PCT/JP2012/081595, dated Aug. 7, 2014 (7 pages).

H. H. P. Gommans al.; "Negative capacitances in low-mobility solids"; Physical Review B, vol. 72, No. 23, pp. 235204-1-235204-6; Dec. 15, 2005 (6 pages).

Extended Search Report issued in corresponding European Application No. 12866845.6, dated Oct. 23, 2015 (8 pages).

Y. Terao et al., "Impedance Spectroscopy of Multilayer Organic Light-Emitting Diode," IDW '08 Proceedings of the 15th International Display Workshops, Dec. 3, 2008, vol. 2, pp. 979-982 (4 pages).

T. Ogiwara et al., "Degradation Analysis of the Blue Phosphorescent Organic Light Emitting Diode by Impedance Spectroscopy and Transient Electroluminescense Spectroscopy," IDW '08 Proceedings of the 15th International Display Workshops, Dec. 3, 2008, vol. 1, pp. 153-156 (4 pages).

Stefan Nowy et al., "Impedance spectroscopy as a probe for the degradation of organic light-emitting diodes," Journal of Applied Physics, Mar. 2, 2010, 107, pp. 054501-1-054501-9 (9 pages).

Stefan Nowy et al., "Impedance spectroscopy of organic cheterolayer OLEDs as a probe for charge carrier injection and device degradation," Proc. of SPIE, 2009, vol. 7415 pp. 74150G-1-74150G-12 (12 pages).

Hyungjun Park et al., "Impedance Spectroscopy Analysis of Organic Light-Emitting Diodes Fabricated on Plasma-Treated Indium-Tin-Oxide surfaces," Journal of the Korean Physical Society, Sep. 2007, vol. 51, No. 3, pp. 1011-1015 (5 pages).

Jose M. Montero et al., "Features of Capacitance and Mobility of Injected Carriers in Organic Layers Measured by Impedance Spectroscopy," Isr. J. Chem., Jun. 4, 2012, 52, pp. 519-528 (10 pages).

International Search Report for corresponding International Application No. PCT/JP2012/081595, dated Mar. 12, 2013 (2 pages).

* cited by examiner

LIGHT

LIGHT

EVALUATION METHOD, EVALUATION DEVICE, EVALUATION PROGRAM, RECORDING MEDIUM, AND MANUFACTURING METHOD FOR ORGANIC ELECTROLUMINESCENCE ELEMENT

TECHNICAL FIELD

The present invention relates to an evaluation method, an evaluation device, an evaluation program, a recording medium, and a manufacturing method for an organic electroluminescence element.

BACKGROUND ART

Conventional performance evaluation of organic electroluminescence elements (organic EL elements) is performed by actually manufacturing organic EL elements and evaluating the same by evaluation methods using voltage-current properties, voltage-luminance properties, current-luminance properties, and the like.

Patent Literature 1 proposes an organic EL element evaluation method which causes a test organic EL element formed on a substrate to emit light by applying a test voltage to the same; measures voltage when the test organic EL element emits light with a predetermined luminance; and compares the measured voltage with a previously set threshold voltage to determine whether the organic EL element has good luminescence properties.

However, this evaluation method cannot perform strict evaluation of organic EL elements including the durability. Even if the above evaluation method provides the same evaluation results as a normal organic EL element evaluation method, drive durability tests can provide different evaluation results.

Accordingly, there is a need for an organic EL element evaluation method which performs easy non-destructive tests in terms of strict performances of an organic EL element, including the durability, within a short time period and can stably supply a lot of organic EL elements having stable device performances.

One of the evaluation methods satisfying such a need is an organic EL element evaluation method by an impedance spectroscopy (IS) method.

The IS method is a measurement method which applies minute sinusoidal voltage signal to an organic EL element; calculates an impedance from the amplitude and phase of the current response signal thereof; and obtains an impedance spectrum as a function of the frequency of the applied voltage signal.

The obtained impedance (Z) is displayed on a complex plane with the frequency of the applied voltage signal as the parameter, which is called a Cole-Cole plot. From the obtained impedance, the modulus (M), admittance (Y), and dielectric constant ($\varepsilon$) as basic transfer functions can be obtained. For example, the modulus (M) is obtained by the following formula (see Non-patent Literature 1, for example).

$$M = j\omega Z$$

In the equation, j indicates an imaginary unit, and $\omega$ indicates $2\pi f$ (f: frequency).

The transfer function adequate for the analytical purpose can be properly selected from the above four transfer functions, and organic EL elements are evaluated by often using M plots that the modulus is plotted on a complex plane.

For example, an evaluation method is disclosed, which applies a voltage not more than a light emission start voltage to an organic EL element and determines that the organic EL element as the evaluation object is non-defective when n>m is satisfied where m is the number of semicircles in the M plot measured by the IS method and n is the number of organic layers (see Patent Literature 2).

Moreover, another disclosed evaluation method applies a voltage not more than a light emission start voltage to a referential organic EL element, compares the profile of the M plot measured by the IS method with the profile of the M plot of the organic EL element as the test object, and determines that the organic EL element as the test object is non-defective when the difference therebetween is within +/−5% (see Patent Literature 3).

CITATION LIST

Patent Literature

Patent Literature 1: Japanese Patent Laid-open Publication No. 2004-192925
Patent Literature 2: Japanese Patent Laid-open Publication No. 2011-34805
Patent Literature 3: Japanese Patent Laid-open Publication No. 2011-34811

Non-Patent Literature

Non-Patent Literature 1: Y. Terao, K. Kawaguchi, M. Nishiura, H. Kimura, T. Saito, M. Ichikawa, T. Okachi and H. Naito, IDW 2008 p. 979

SUMMARY OF INVENTION

Problems to be Solved by Invention

However, in the analysis of the M plot measured by the IS method for an organic EL element having a large light emitting element area (2500 mm$^2$) which is not less than 100 mm$^2$, there is no component observed other than the components of a single semicircle and contact resistance, as illustrated in FIG. 17. Other M plot analyses for some large-area organic EL elements having different light emitting element areas and the same device configuration produce the same results. The difference between the organic EL elements cannot be found by the organic EL element evaluation method using M plots. Moreover, driving deterioration tests are performed for the same group of organic EL elements, showing differences in emission lifetime between the organic EL elements.

This is considered to be because the organic EL elements used in Patent Literatures 2 and 3 have small light emitting element areas and the organic EL elements are driven with a voltage not more than light emission start voltage in order to obtain a circular M plot corresponding to each organic layer.

As described above, the evaluation method using M plots is found to be inadequate to evaluate large-area organic EL elements intended for illumination uses and the like.

Accordingly, a major object of the present invention is to provide a method capable of evaluating device performances of a large-area organic electroluminescence element and especially provide a method of severely evaluating the durability.

Means for Solving Problems

In order to solve the aforementioned problem, according to the present invention, provided is a method of evaluating an organic electroluminescence element which includes at least a light emitting layer between an anode and a cathode and has a light emitting element area of not less than 100 mm² and not more than 1 m², the method including the steps of:

applying a direct-current voltage not less than a light emission start voltage to the organic electroluminescence element and measuring an impedance spectrum of the organic electroluminescence element;

calculating a capacitance from the impedance spectrum; and determining whether a value of the capacitance is positive or negative.

Effects of Invention

According to the present invention, it is possible to provide a method of evaluating the device performances of a large-area organic electroluminescence element, especially the method capable of severely evaluating the durability.

MODES FOR CARRYING OUT THE INVENTION

First Embodiment

Figure 1:
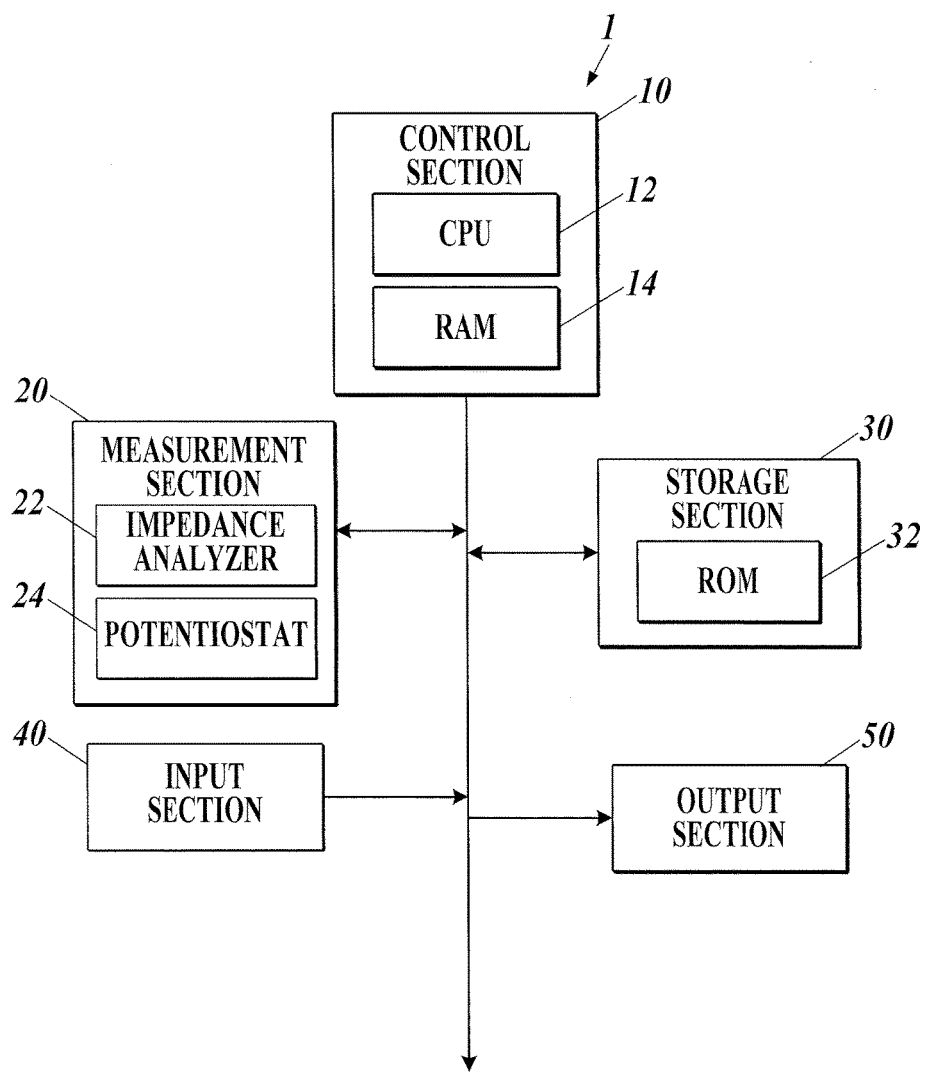
FIG. 1 is a block diagram illustrating a schematic configuration of an evaluation device.

Hereinafter, a description is given of preferred embodiments of the present invention with reference to the drawings.

<Organic EL Element>

(1) Configuration of organic EL Element

An organic EL element according to the present invention includes a supporting board (substrate), electrodes, organic layers having various functions, and the like. Specific examples having preferred configurations are shown but do not limit the present invention.

(i) anode/hole transport layer/electron blocking layer/light emitting layer unit/hole blocking layer/electron transport layer/cathode (ii) anode/hole transport layer/electron blocking layer/light emitting layer unit/hole blocking layer/electron transport layer/cathode buffer layer/cathode (iii) anode/anode buffer layer/hole transport layer/electron blocking layer/light emitting layer unit/hole blocking layer/electron transport layer/cathode (iv) anode/anode buffer layer/hole transport layer/electron blocking layer/light emitting layer unit/hole blocking layer/electron transport layer/cathode buffer layer/cathode The aforementioned hole transport layer, electron blocking layer, hole blocking layer, electron transport layer, and later-described intermediate layers are collectively referred to as carrier control layers.

"Carriers" refer to electrons and holes. The "carrier transport layer" refers to a layer which is made of a carrier transport material and preferably is composed of a p-type or n-type semiconductor layer. Herein, the "p-type or n-type semiconductor layer" refers to an organic layer containing an electron-accepting compound or an electron donating compound and is semiconducting.

(2) Light Emitting Layer Unit

A light emitting layer unit according to the present invention is a structural unit including plural or a singular light emitting layer.

In the case of including plural light emitting layers, the light emitting layer unit includes stacked organic layers from the light emitting layer closest to the anode to the light emitting layer closest to the cathode. Specifically, each light emitting layer is an organic layer containing a luminescent compound of a different luminescent color. The unit may include non-light emitting intermediate layers between the light emitting layers.

Moreover, the light emitting layers according to the present invention are layers in which electrons and holes injected from the electrodes, electron transport layer, or hole transport layer are recombined to emit light. The light emitting portion may be within each light emitting layer or in the interface between the light emitting layer and the layer adjacent thereto.

The total thickness of the light emitting layers according to the present invention is not particularly limited but is preferably controlled to a range from 10 to 100 nm and more preferably a range from 20 to 50 nm. This is to provide uniform quality layers, prevent unnecessary high voltage from being applied at the time of light emission, and enhance the stability of luminescent color with respect to the driving current.

At forming discontinuous light emitting layers according to the present invention by vacuum deposition, it is necessary to properly control the deposition rates and amounts of host compounds, luminescent dopants, and the like. The deposition rate is preferably not more than 0.05 nm/sec, and more preferably, 0.03 nm/sec. By setting the deposition rate comparatively low, the host compound and/or luminescent dopant can be selectively deposited in a specific site. The preferable deposition amount can be adjusted in accordance with the desired layer thickness and discontinuity.

Moreover, it is preferable to use a mask corresponding to the deposition pattern to limit the deposition site.

In the case of including plural light emitting layers, the order in which blue, green, yellow, and red light emitting layers are stacked is not particularly limited. However, it is preferable that the blue light emitting layer is provided closest to the cathode among the light emitting layers.

Next, a description is given of the host compounds and luminescence dopants contained in the light emitting layers.

(2-1) Host Compound

The host compounds contained in the light emitting layers of the organic EL element according to the present invention include: a compound which moves energy of excitons generated by recombination of carriers on the same host compound to the luminescent dopant, causing the luminescent dopant to emit light; and a compound which allows the luminescent dopant to trap carriers on the host compound and generate excitons on the luminescent dopant, causing the luminescent dopant to emit light. Accordingly, the luminescence ability of the host compound itself should be lower. For example, the host compound is a compound whose phosphorescence quantum yield of phosphorescence emission at room temperature (25° C.) is less than 0.1 and preferably less than 0.01.

Moreover, preferably, the proportion of the host compound is 20 mass % or more in the compounds contained in the light emitting layer.

The host compound may include a publicly-known host compound singularly or plural types of the same in combination. Use of the plural types of host compounds allows control of movement of electrical charges and can increase the efficiency of the organic EL element.

Moreover, by using plural types of phosphorescent compounds to be used as later-described luminescent dopants, different luminescences can be mixed, thereby providing an arbitrary luminescent color. The type and doped amount of phosphorescent compound can be adjusted, which allows the organic EL elements to be applied to illuminations and backlights.

(2-2) Glass Transition Temperature: Tg

The organic compound of each layer constituting the organic EL element according to the present invention preferably contains a material having a glass transition temperature (Tg) of not less than 100° C. as much as at least 80 mass % of the layer.

Herein, the glass transition temperature (Tg) is a value obtained by a JIS-K-7121 compliant method using DSC (differential scanning colorimetry). By using the host compounds having same physical properties as described above, and more preferably, by using the host compounds having a same molecular structure, the organic EL element has uniform film properties over the whole organic compound layer. Moreover, by adjusting the phosphorescent energy of the host compound to 2.9 eV or more, the energy transfer from the dopant can be efficiently reduced, thus providing high luminance.

(2-3) Phosphorescent Light Emitting Dopant

The light emitting layer or light emitting layer unit of the organic EL element according to the present invention preferably contains a phosphorescent light emitting dopant as well as the aforementioned host compound from the perspective of providing a higher luminescence efficiency for the organic EL element.

The phosphorescent light emitting dopant is a compound in which phosphorescence arising from an excited triplet state is observed. Specifically, the phosphorescent light emitting dopant is a compound phosphorescent at room temperature (25° C.) and has a phosphorescence quantum yield of 0.01 or more and more preferably, 0.1 or more.

The phosphorescence quantum yield is measured by a method described in the "Dai-yon-han Zikken Kagaku Kouza 7 no Bunkou II (fourth series of experimental chemistry 7, Spectroscopy II)", p. 398, 1992, Maruzen. Although the phosphorescence quantum yield in a solution can be measured using various types of solvents, the phosphorescent light emitting dopant according to the present invention only needs to achieve the aforementioned phosphorescence quantum yield (0.01 or more) for any solvent.

The phosphorescence of the phosphorescent light emitting dopant includes two types of principle. One is an energy transfer type in which, on the host compound to which the carriers are transported, the carriers are recombined to bring the host compound to an excited state; and the energy thereof is transferred to the phosphorescent light emitting dopant to cause light emission from the phosphorescent light emitting dopant. The other one is a carrier trap type in which the phosphorescent light emitting dopant serves as a carrier trap to recombine the carriers on the phosphorescent light emitting dopant to cause light emission from the phosphorescent light emitting dopant. In either case, the excited state energy of the phosphorescent light emitting dopant needs to be lower than the excited state energy of the host compound.

The phosphorescent light emitting dopant can be properly selected from publicly-known compounds used in the light emitting layers of organic EL elements.

For example, the phosphorescent light emitting dopant is preferably a complex compound containing metal of the groups 8 to 10 in the periodic table, more preferably, an iridium compound, an osmium compound, a platinum compound (a platinum complex compound), or a rare-earth complex, and particularly preferably an iridium compound.

The phosphorescent light emitting dopant can contain a conventionally known compound shown below.

[Compound 1]

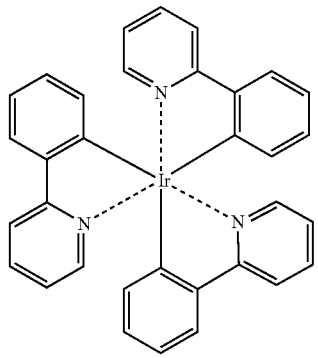

Ir-1

Ir-2
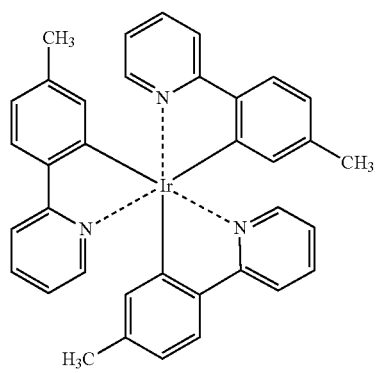
Ir-3
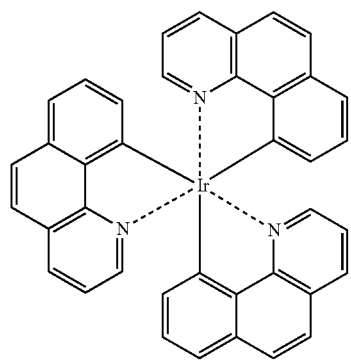
Ir-4
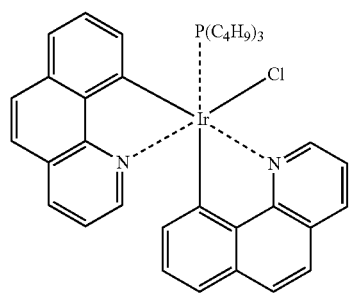
Ir-5
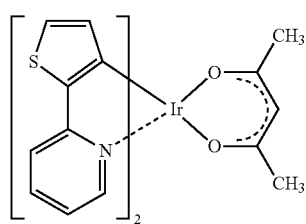
Ir-6
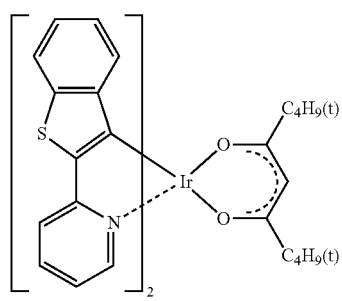
[Compound 2]
Ir-7
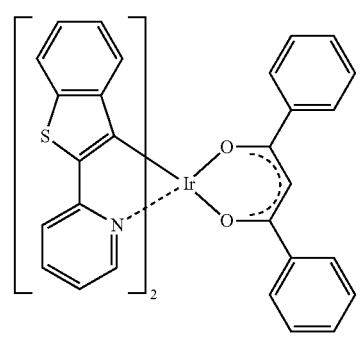
Ir-8
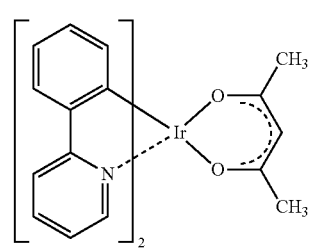
Ir-9
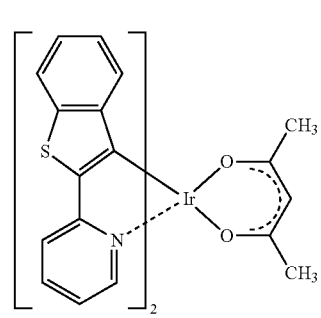
Ir-10
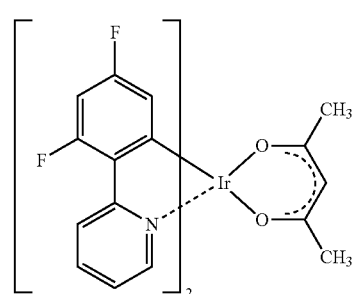
Ir-11
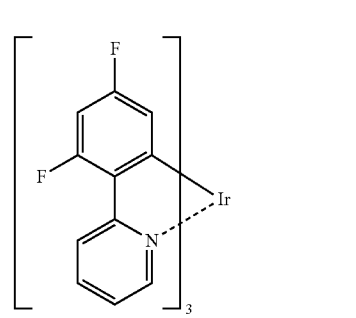

-continued
Ir-12
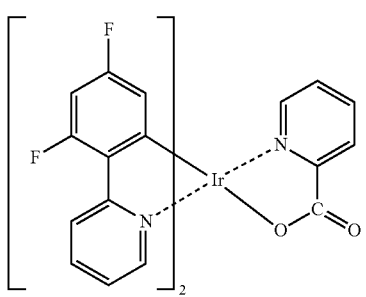
Ir-13
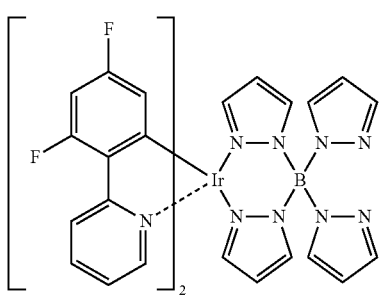
Ir-14
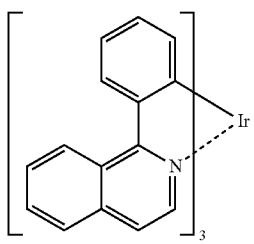
[Compound 3]
Ir-15
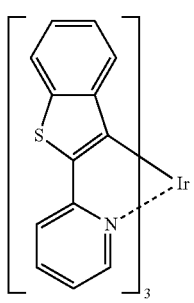
Ir-16
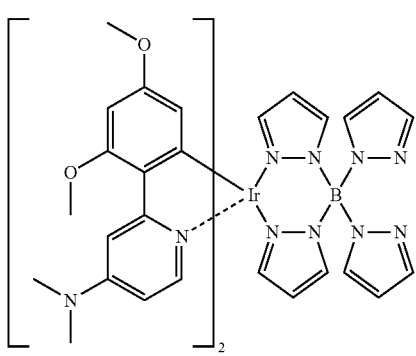
Pt-1
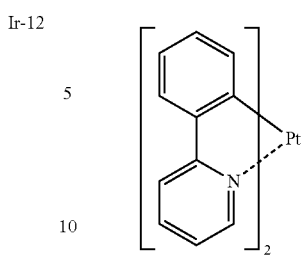
Pt-2
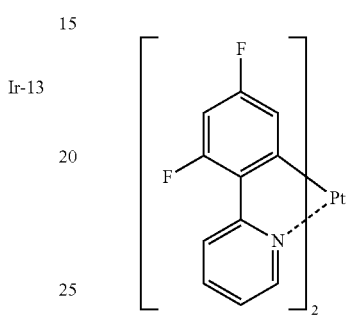
Pt-3
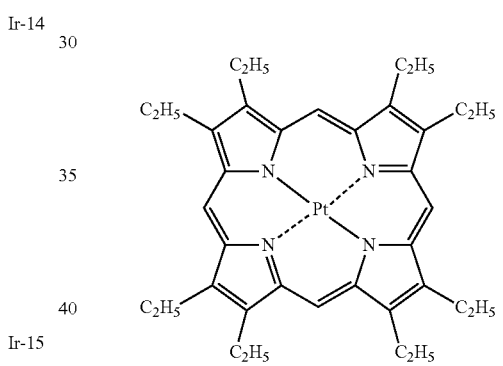
A-1
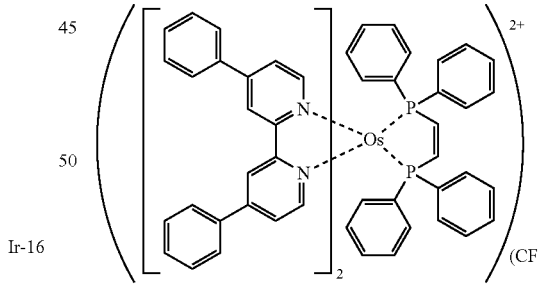
[Compound 4]
Rh-1
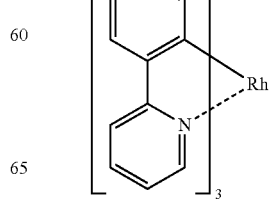

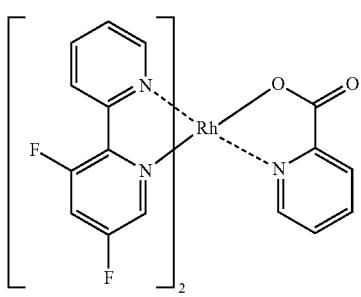

Rh-2

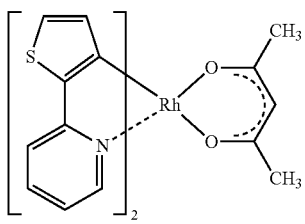

Rh-3

(3) Film Formation by Application

The organic compound thin films (organic layers) including the hole injection layer, hole transport layer, light emitting layer, hole blocking layer, and electron transport layer can be formed by using application methods such as spin coating, ink jetting, spraying, and printing.

As the organic EL element materials suitable for application, publicly-known compound materials can be used. Specifically, the organic EL element materials can be compounds described in Japanese Patent Laid-open Publication No. 2010-272286 and the like.

In the present invention, examples of the liquid media into which the organic EL element materials are dissolved or dispersed at preparation of the application liquid (dispersion liquid in some cases) are organic solvents including ketones such as methylethylketone and cyclohexanone, fatty acid esters such as ethyl acetate, halogenated hydrocarbons such as dichlorobenzene, aromatic hydrocarbons such as toluene, xylene, mesitylene, and cyclohexylbenzene, aliphatic hydrocarbons such as cyclohexane, decaline, and Dodecane, DMF, and DMSO.

The method of dispersing the organic EL element materials can be a dispersion method such as ultrasonic dispersion, high shear dispersion, and media dispersion.

After these layers are formed, thin film of a cathode substance is formed on the same by vapor deposition, sputtering, or the like, for example, to a film thickness of not more than 1 μm and preferably to a thickness ranging from 50 to 200 nm to form the cathode, thus providing a desired organic EL element.

(4) Use Application

The organic EL element of the present invention can be used in display devices, displays, and various light emission sources. Examples of the light emission sources are illuminations (home illuminations, vehicle interior illuminations), backlights for clocks and liquid crystal displays, billboards, traffic signals, light sources for optical storage media, light sources for electrophotographic copiers, light sources for optical communication processors, and light sources for optical sensors. The organic EL element of the present invention, not limited to the above applications, is effectively used in applications as backlights for liquid crystal displays and illumination light sources in particular.

As for the organic EL element of the present invention, patterning may be performed by using a metallic mask, ink-jet printing method, or the like in the process of film formation when needed. Patterning may be performed for only the electrodes, for the electrodes and light emitting layers, or for all the layers of the device. The patterning may be performed using conventionally known methods in preparation of the devices.

<Evaluation Device>

As an example of the evaluation device of an organic EL element, an impedance spectrum measurement system 1 is used as illustrated in FIG. 1.

The impedance spectrum measurement system. 1 mainly includes a control section 10, a measurement section 20, a storage section 30, an input section 40, and an output section 50.

The control section 10 mainly includes a CPU 12 and a RAM 14.

The CPU 12 controls each section of the impedance spectrum measurement system 1 in a centralized manner. The CPU 12 expands a program, which is specified out of the system program and various application programs stored in the storage section 30, in a RAM 14, and executes various processes in cooperation with the program expanded in the RAM 14. For example, the CPU 12 executes a later-described measurement process in cooperation with the program to function as a data creation member and a determination member.

The RAM 14 includes: a program loading area in which the CPU 12 expands a program for execution; and a work area which temporarily stores input data inputted from the input section 40, various processing results, and the like.

The measurement section 20 is mainly composed of an impedance analyzer 22 and a potentiostat 24.

The potentiostat 24 superimposes an AC voltage of 30 to 100 mVrms (frequency range: 0.1 Hz to 10 MHz) onto DC voltage and applies the same to the organic EL element.

The impedance analyzer 22 receives response current signal from the organic EL element to which the voltage is applied and sends the signal to the control section 10.

The conventional IS methods widely use a measurement system including the impedance analyzer 22 (Impedance Analyzer 1260 by Solartron, for example) and a dielectric interface (Dielectric Interface 1296 by Solartron, for example).

In the measurement system including the impedance analyzer 22 and dielectric interface, the system specification of the maximum DC current is 100 mA, and in the measurement system including the impedance analyzer 22 and potentiostat 24, the system specification of the maximum DC current is 2 ampere.

In an organic EL element having a light emitting element area of about 2 mm×2 mm, the current required to obtain a luminance of 100 cd/m$^2$ is about 10 μA. The driving current increases in proportion to the light emitting element area, and when the light emitting element area has a size of 50×50 mm, which is practical for illumination use, the current required to obtain the same luminance of 100 cd/m$^2$ reaches 5 mA or more.

Accordingly, for accurately measuring minute AC signal superimposed on large current (DC current of 1 mA or more), the impedance measurement system including the potentiostat 24 as described above is preferable.

Specifically, the impedance analyzer 22 can be Impedance analyzer 1260 made by Solartron.

Specifically, the potentiostat 24 can be specifically Potentiostat 1287 made by Solartron.

If the measurement requires a current of 2 ampere or more, Power booster PBi250 made by TOYO corporation can be used, which enables measurement up to 25 ampere.

"The light emitting element area" refers to a total area of the portions which emit light by application of voltage in the whole organic EL element. The portions emitting light may have any shapes, including a square, a rectangular, a circular, and an elliptical shapes. Moreover, the organic EL element may has a form of circuit in which independent light emitting portions are connected in parallel or in series.

In the analysis of the IS method, an equivalent circuit of the organic EL element is estimated from the trajectory of a Cole-Cole plot, and the trajectory of the Cole-Cole plot calculated from the equivalent circuit is made corresponding to the measurement data, determining the equivalent circuit. The equivalent circuit analysis uses Zview by Scribver Associates, for example.

The storage section 30 is a memory composed of a semiconductor read-only memory such as a ROM (read only memory) 32 or the like and stores programs and data for implementing various functions of the impedance spectrum measurement system 1.

The storage section 30 includes a recording medium (not shown) previously storing programs and data. The recording medium can be attached to the storage section 30 fixedly or detachably. Each program is stored in a form of readable program codes, and the CPU 12 sequentially executes the operation in accordance with the program codes.

Moreover, the storage section 30 may be composed of an HDD or the like.

The input section 40 is a device through which commands (instructions), data, and the like are inputted from the outside into the impedance spectrum measurement system 1 and is composed of a touch panel, a keyboard, and the like, for example.

The output section 50 is a device configured to output the commands and data inputted from the input section 40, the operation results of the control section 10, and the like and is composed of a display such as an LCD (liquid crystal display) or an ELD (electroluminescence display) and a printing device such as a printer.

The output section 50 may be configured to constitute a touch panel integrally with the input section 40.

<Evaluation Method>

Figure 2:
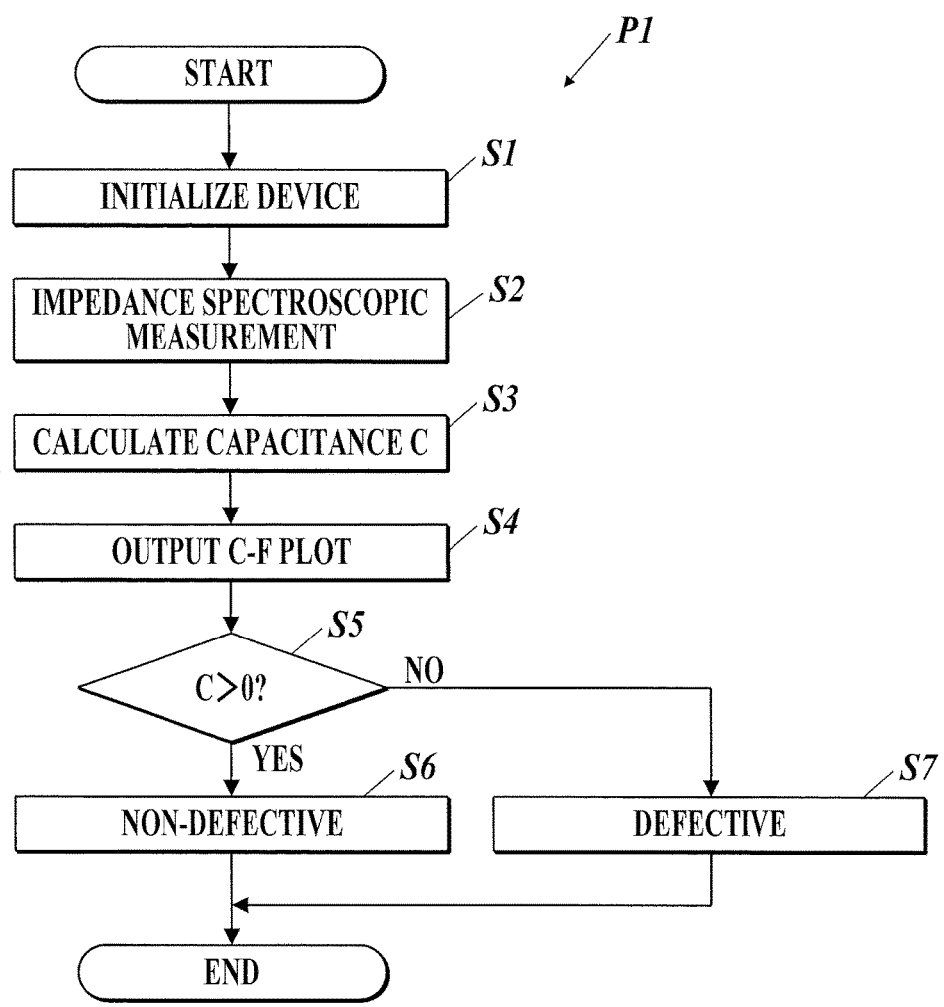
FIG. 2 is a flowchart for explaining an operation of the evaluation device.

FIG. 2 is a flowchart showing a flow of the measurement process that the control section 10 executes by reading an evaluation program P1 from the storage section 30. The evaluation program P1 is stored in a recording medium and excutes steps S1 to S7 described later.

The evaluation method using the evaluation program P1 is applicable to an organic EL element having a light emitting element area of 100 mm$^2$ to 1 m$^2$.

In the step S1, when a power switch (not shown) is turned on, the impedance spectrum measurement system 1 is started, and the control section 10 initializes necessary sections.

In the step S2, when the control section 10 accepts a command to instruct start of measurement from the input section 40, the control section 10 instructs the measurement section 20 to start measurement of the impedance spectrum of an organic EL element as a measurement object.

Specifically, a DC voltage not less than the light emission start voltage previously calculated by the voltage-luminance property is applied to the organic EL element. In this process, it is preferable to apply such a voltage that the organic EL element has a luminance of 1 cd/m$^2$ or more.

Moreover, the measurement frequency range of the impedance spectrum is preferably 1 µHz to 10 MHz. The frequencies not more than 1 µHz and not less than 10 MHz are out of the measurement frequency range of the impedance spectrum measurement system 1 that can be practically used, which are not preferable. The measurement frequency range of the impedance spectrum is more preferably 10 mHz to 10 kHz. The electrodes have great influences at the frequencies of not less than 10 kHz, which are not suitable for evaluation of the light emitting layers. Moreover, the measurement takes a lot of time with the frequencies of not more than 10 mHz, which are not suitable for practical use.

In step S3, the control section 10 calculates the impedance based on the amplitude and phase of the response current signal obtained by the measurement section 20 and calculates the capacitance (C) from the calculated impedance.

The capacitance is calculated by the following formula.

$$C=(1/\omega)(-ImZ/(Re^2Z+Im^2Z))$$

Herein, ω is 2πf (f: frequency); Z, impedance; ReZ, a real part of the impedance; and ImZ, an imaginary part of the impedance.

In the step S4, a capacitance-frequency plot (C-F plot) showing the capacitance on the vertical axis and the frequency on the horizontal axis is outputted to the output section 50.

The C-F plot is an electrical property obtained from the impedance spectrum similarly to the Cole-Cole plot.

In the step S5, the control section 10 determines whether the values of the capacitance are positive over the whole frequency range in the C-F plot. When determining that the capacitance has positive values (C>0) over the whole frequency range (step S5: YES), the control section 10 determines that the organic EL element is non-defective and outputs the determination result to the output section 50 (step S6). The process is then terminated.

When determining that all the values of the capacitance are not positive (C<0) in the whole frequency range (step S5: NO), the control section 10 determines that the organic EL element is defective and outputs the determination result to the output section 50 (step S7). The process is then terminated.

Figure 3A:
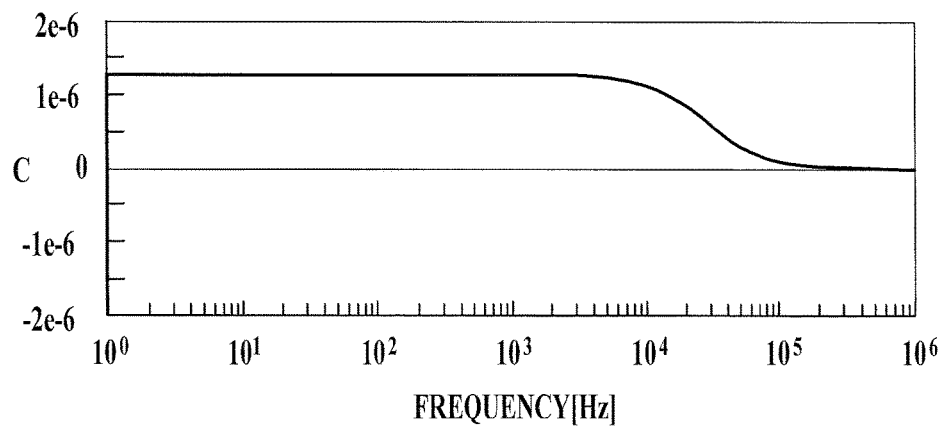
FIG. 3A is a diagram schematically showing a C-F plot.
Figure 3B:
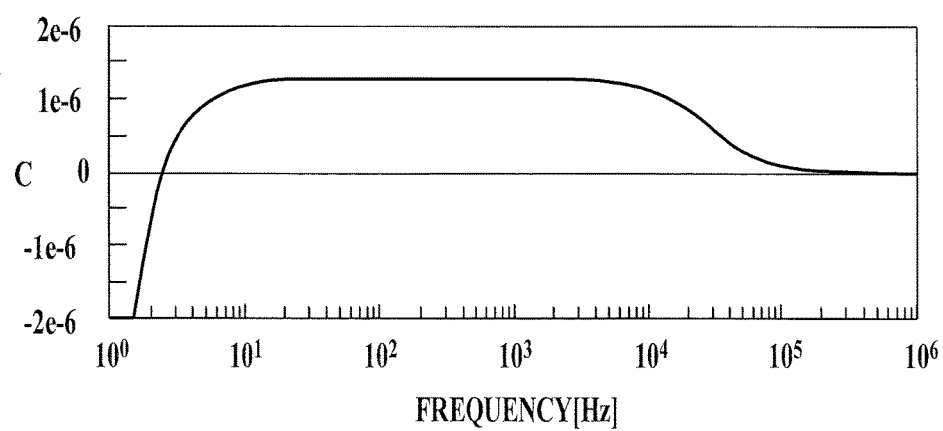
FIG. 3B is a diagram schematically showing a C-F plot.

For example, the organic EL element is determined to be non-defective when all the values of the capacitance are positive in the measurement frequency range as illustrated in FIG. 3A. The organic EL element is determined to be defective when there is a range where the capacitance has negative values in the measurement frequency range as illustrated in FIG. 3B.

In this embodiment, the organic EL element being non-defective means that the organic EL element has high performances including the luminescence efficiency and durability, and the organic EL element being defective means that the organic EL element has a emission lifetime 10% or more shorter than that of the referential organic EL element.

The values of the capacitance in the C-F property only need to be positive but are preferably in a range of 0.01% or more and 10$^6$% or less of geometric capacitance $C_0$ of the organic EL element.

The geometric capacitance $C_0$ is calculated by the following equation.

$$C_0=\varepsilon_0 S/d$$

Herein, $\varepsilon_0$ is a vacuum dielectric constant, S is a light emitting element area, and d is the film thickness of the organic EL element.

According to the embodiment described above, it is possible to strictly evaluate the durability of a large-area organic EL panel having a light emitting element area of 100 mm² to 1 m².

The conventional evaluation method using M plots does not show a difference in profile between the M plots of large-area organic EL panels different in durability, and driving deterioration tests thereof provide different results. Thus, the conventional evaluation method cannot conduct strict durability evaluation.

However, by the evaluation method using C-F plots as shown in the embodiment, the profiles of the C-F plots of large-area organic EL panels having different durability are varied depending on the durability thereof. Accordingly, the evaluation method using C-F plots can strictly evaluate the durability as well as the luminescence efficiency.

Moreover, the aforementioned impedance spectrum measurement may be performed under the following conditions (see variations).

[Variation]

The DC voltage applied to the organic EL element by the measurement section 20 is preferably such a voltage that the light emission luminance of the organic EL element is 1 to 500 cd/m².

Moreover, the measurement frequency range of the impedance spectrum is 1 Hz to 10 kHz.

In the variation, the evaluation method using the evaluation program P1 is applicable to an organic EL element having a light emitting element area of 100 mm² to 1 m² but is preferably applicable to an organic EL element having a smaller light emitting element area among the large-area devices. Specifically, the evaluation method using the evaluation program P1 is applicable to an organic EL element having a light emitting element area of 100 mm² to 10000 mm².

Second Embodiment

A second embodiment is different from the first embodiment mainly in the following points.

Figure 4:
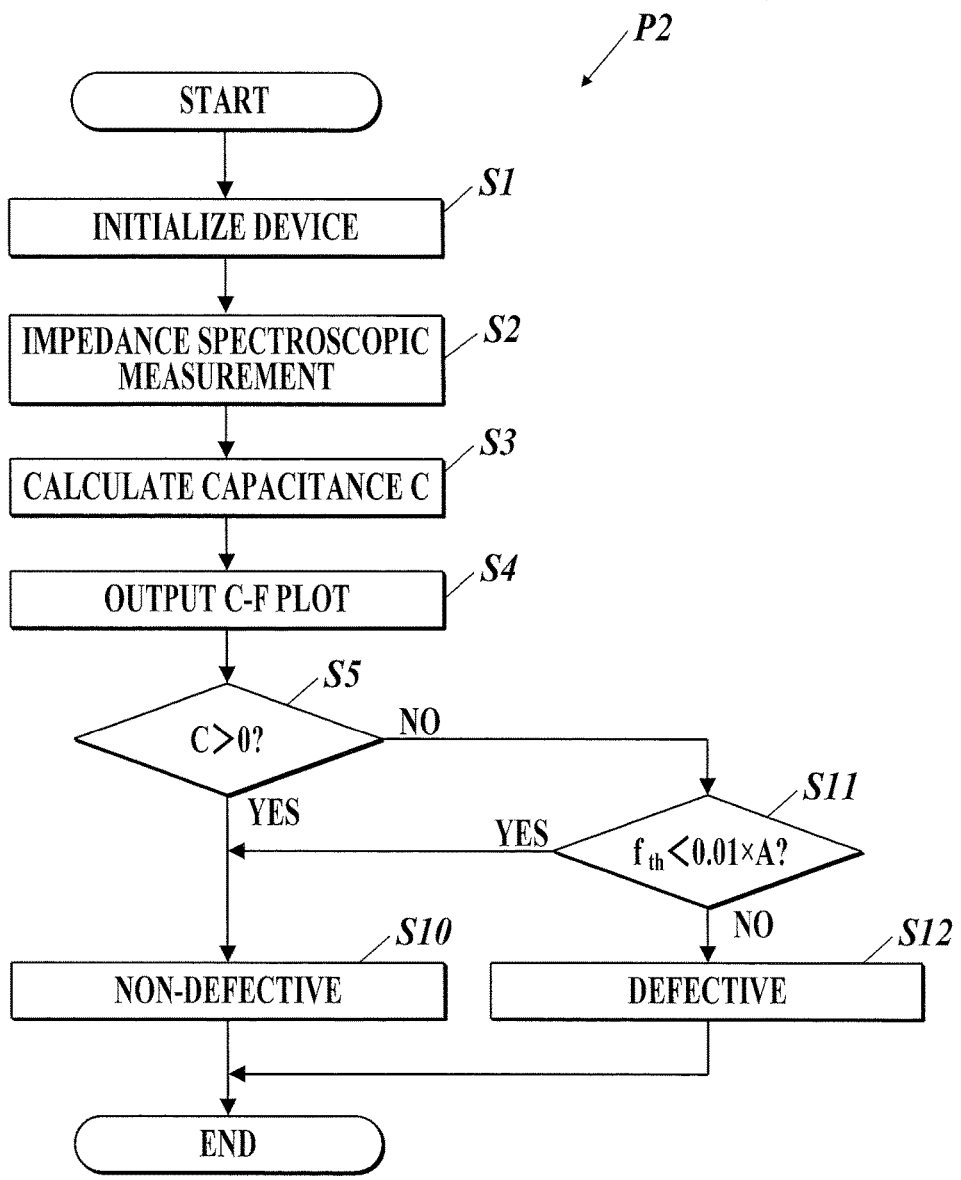
FIG. 4 is a flowchart for explaining an operation of the evaluation device.

FIG. 4 is a flowchart showing a flow of a measurement process that the control section 10 executes by reading an evaluation program P2 from the storage section 30. The evaluation program P2 is stored in a recording medium and executes steps S1 to S5 and S10 to S12.

The evaluation method using the evaluation program P2 is applicable to an organic EL element having a light emitting element area of 100 mm² to 1 m² but is preferably applicable to an organic EL element having a larger light emitting element area among large-area devices. Specifically, the evaluation method using the evaluation program P2 is applicable to an organic EL element having a light emitting element area of 10000 mm² to 1 m².

In the step S2, when the control section 10 accepts a command to instruct start of measurement from the input section 40, the control section 10 instructs the measurement section 20 to start measurement of the impedance spectrum of an organic EL element as a measurement object.

Specifically, a DC voltage not less than the light emission start voltage previously calculated by the voltage-brightness property is applied to the organic EL element. In this process, the applied voltage is preferably such a voltage that the organic EL element has an light emission luminance of 10 to 5000 cd/m².

Moreover, the measurement frequency range of the impedance spectrum is preferably 1 Hz to 10 kHz.

In the step S5, the control section 10 determines whether the capacitance has positive values over the whole frequency range in the C-F plot. When determining that all the values of the capacitance are positive (C>0) over the whole frequency range (step S5: YES), the control section 10 determines that the organic EL element is non-defective and outputs the determination result to the output section 50 (step S10). The process is then terminated.

When determining in the step S5 that all of the values of the capacitance are not positive (C<0) in the whole frequency range (step S5: NO), the control section 10 performs the process of step S11.

In the step S11, when threshold frequency $f_{th}$ satisfies the condition by Formula (1) (Step S11: YES), the control section 10 determines that the organic EL element is non-defective and outputs the determination results to the output section 50 (step S10). The process is then terminated. Herein, the threshold frequency $f_{th}$ is the lowest frequency of the range in which the capacitance has positive values (see FIG. 5).

$$f_{th} < 0.01 \times A \quad (1)$$

Herein, A is the light emitting element area (mm²).

When the threshold frequency $f_{th}$ does not satisfy the condition of Formula (1) (Step S11: NO), the control section 10 determines that the organic EL element is defective and outputs the determination result to the output section 50 (step S12). This process is then terminated.

Figure 5:
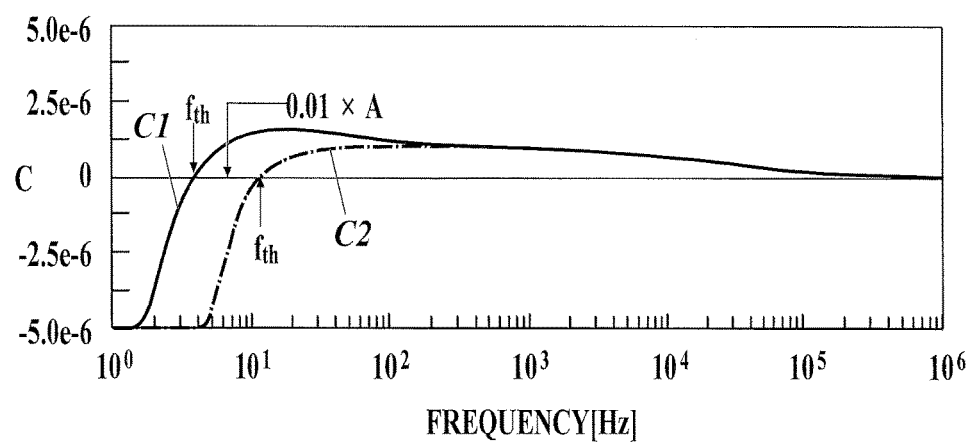
FIG. 5 is a diagram for explaining a threshold frequency in a capacitance-frequency plot.

For example, as shown in FIG. 5, when the threshold frequency $f_{th}$ is less than 0.01×A (a curve C1 in FIG. 5), the organic EL element is determined to be non-defective. When the threshold frequency $f_{th}$ is more than 0.01×A (a curve C2 in FIG. 5), the organic EL element is determined to be defective.

According to the aforementioned embodiment, it is possible to obtain the same effects as those of the first embodiment.

Unlike the first embodiment, large-area organic EL panels excellent in durability can be evaluated by the threshold frequency even if negative capacitance is observed.

Generally, the capacitance of inorganic semiconductors is always positive. However, it is known that the capacitance of organic EL elements can be negative at low frequencies (about not higher than 100 Hz). This is called negative capacitance, which has been reported in many cases including both low-molecular and high-molecular type devices (see FIG. 3B).

For example, Non-patent Literature 1 reveals that there is a relationship between the negative capacitance and the luminescence efficiency of an organic EL element.

The cause of the negative capacitance is considered to be that any kind of carriers are excess at the light emission start voltage at which double injection of holes and electrons occurs, that is, because of imbalance of carriers. Another cause thereof is that when the recombination probability is low and the carrier lifetime is long, the excess carriers travel between the anode and cathode by the AC voltage and reach the same.

Moreover, when the light emitting element area is increased, the DC current in the entire element is increased, and the negative capacitance is more likely to occur in some cases. For example, the negative capacitance is more likely to occur because the DC current required to obtain a brightness of 10 to 5000 cd/m² becomes large.

It is confirmed that the negative capacitance is observed in some of large-area organic EL elements which are formed using the materials and layer configurations developed by the inventors of this patent application and have high luminescence efficiency and is not observed in the others. Moreover, it is revealed that there is a relationship between the presence/absence of the negative capacitance and the lifetime of the organic EL elements which have actually continued to be driven to be deteriorated.

The cause of no observation of the negative capacitance is considered to be that in the organic EL elements having high luminescence efficiency, the recombination is efficiently performed and the carriers are balanced, and thereby there is only a small amount of excess carriers.

According to the first embodiment, a large-area organic EL panel as an evaluation object can be evaluated to have good luminescence efficiency and durability as long as at least all the values of capacitance are positive in the frequency range of measurement. However, when the negative capacitance is observed, it cannot be accurately determined whether the organic EL panel is non-defective or defective.

Accordingly, in this embodiment, it is found that the durability of a large-area organic EL panel can be accurately evaluated depending on whether the threshold frequency satisfies the predetermined conditions even if the negative capacitance is observed.

Example 1

(1) Preparation of Samples (1.1) Preparation of Organic EL Panels 1-1 and 2-1

Organic EL panels 1-1 and 2-1 are simultaneously prepared.

As an anode, ITO (indium tin oxide) is formed into 150 nm thick film on two 15 mm×15 mm glass substrates (transparent supporting substrates) with a thickness of 0.4 mm, and the obtained products are masked and patterned so that the ITO area is 10 mm×10 mm. The transparent supporting substrates with the ITO transparent electrodes applied thereon are ultrasonically cleaned with isopropyl alcohol, dried with dry nitrogen gas, and subjected to UV ozone cleaning for five minutes.

The thus-obtained transparent supporting substrates are individually fixed to substrate holders of a commercially-available vacuum deposition device, and masks are placed so that the light emitting element area is 10 mm×10 mm. A crucible for vapor deposition in the vacuum deposition device is filled with proper amounts of CuPc (cupper phthalocyanine), NPD, Fir (pic), DPVBi, CBP, Ir (ppy)$_3$, Ir (piq)$_3$, BAlq, Alq, and Lif for device preparation. The crucible for vapor deposition is made of a material for resistance heating of molybdenum or tungsten.

Next, after the vacuum deposition device is reduced in pressure to a vacuum of $4\times10^{-4}$ Pa, the crucible for vapor deposition including CuPc is supplied with electricity to be heated. CuPc is then deposited on the ITO electrode side of the transparent supporting substrate at a deposition rate of 0.1 nm/sec, thus providing a 15 nm thick hole injection layer.

Subsequently, NPD is deposited on the hole injection layer at a deposition rate of 0.1 nm/sec to provide a 25 nm thick hole transport layer.

Then, 3 mass % Fir (pic) and DPVBi as the host are co-deposited on the hole transport layer at a total deposition rate of 0.1 nm/sec to provide a 15 nm thick blue light emitting layer.

After that, as an intermediate layer, CBP is deposited on the blue light emitting layer at a deposition rate of 0.1 nm/sec to be 5 nm.

Subsequently, 5 mass % Ir(ppy)$_3$ and CBP as the host are co-deposited on the intermediate layer at a total deposition rate of 0.1 nm/sec to provide a 10 nm thick green light emitting layer.

Then, as an intermediate layer, CBP is deposited on the green light emitting layer at a deposition rate of 0.1 nm/sec to be 5 nm.

After that, 8 mass % Ir(piq)$_3$ and CBP as the host are co-deposited on the intermediate layer at a total deposition rate of 0.1 nm/sec to provide a 10 nm thick red light emitting layer.

Subsequently, as a hole blocking layer, BAlq is deposited to be 15 nm on the red light emitting layer at a deposition rate of 0.1 nm/sec.

Then, Alq is deposited to 30 nm as an electron transport layer on the hole blocking layer at a deposition rate of 0.1 nm/sec.

After that, as an electron injection layer, LiF is deposited to be 1 nm on the electron transport layer at a deposition rate of 0.1 nm/sec.

Subsequently, aluminum is deposited to be 110 nm to form a cathode, thus preparing an organic EL element having a light emitting element area of 10 mm×10 mm.

[Compound 5]

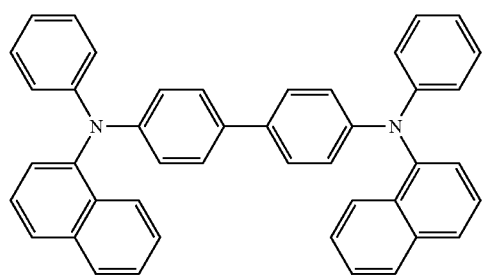

α-NPD

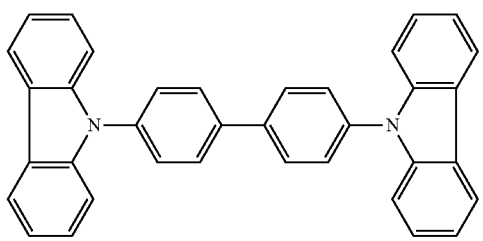

CBP

-continued
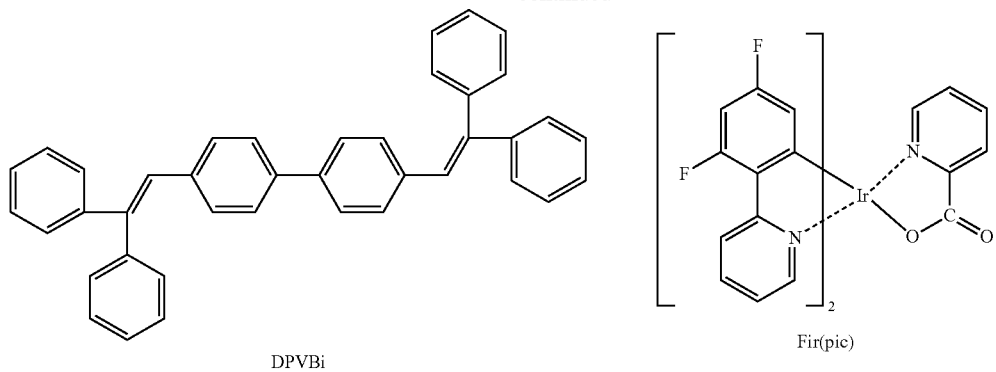
DPVBi
Fir(pic)
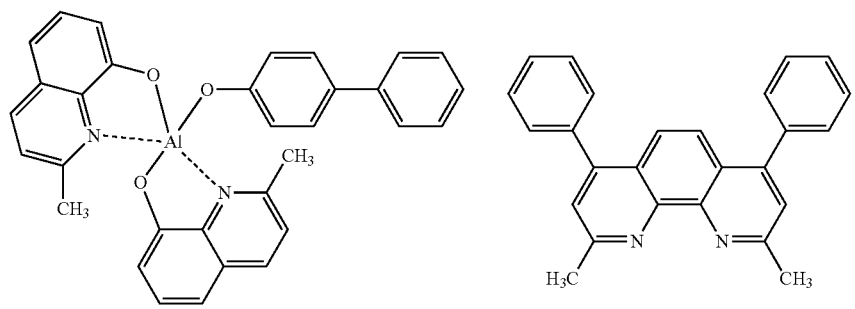
BAlq
BCP
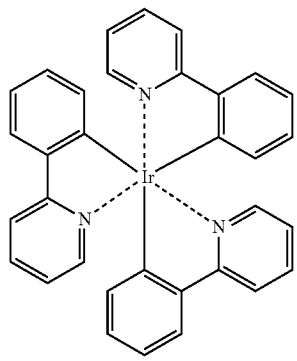
Ir(ppy)₃
[Compound 6]
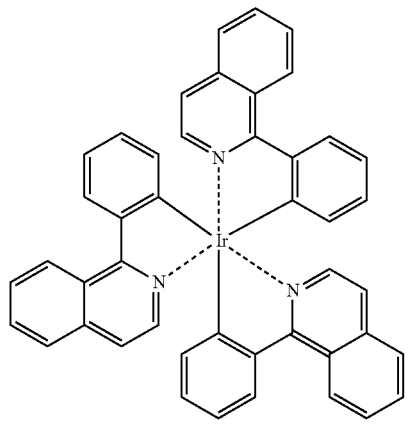
Ir(piq)₃
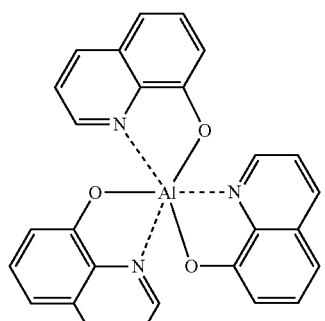
Alq₃

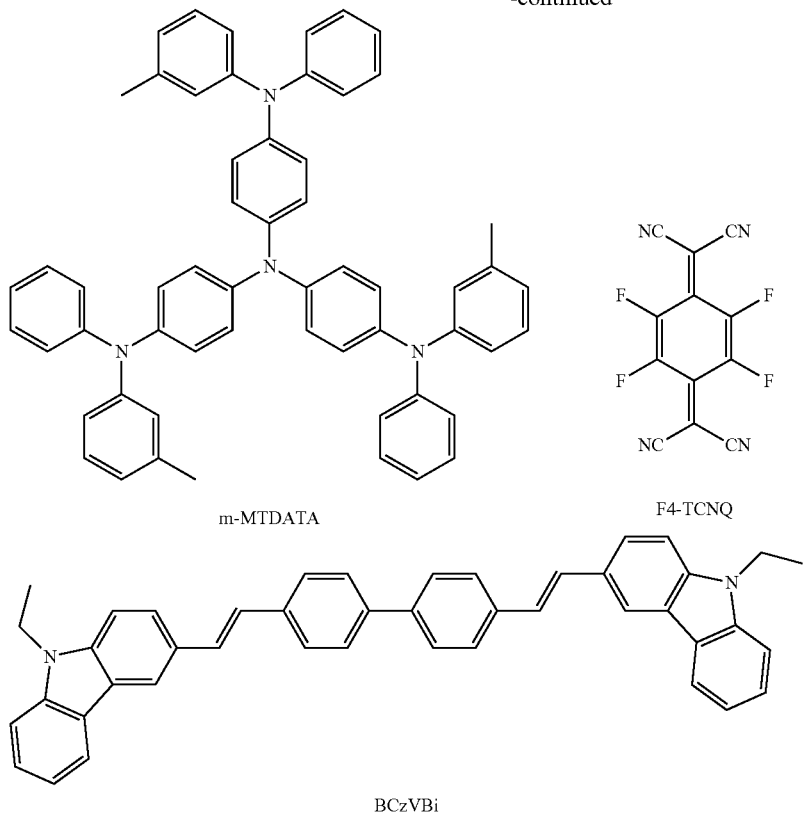

m-MTDATA

F4-TCNQ

BCzVBi

Figure 6A:
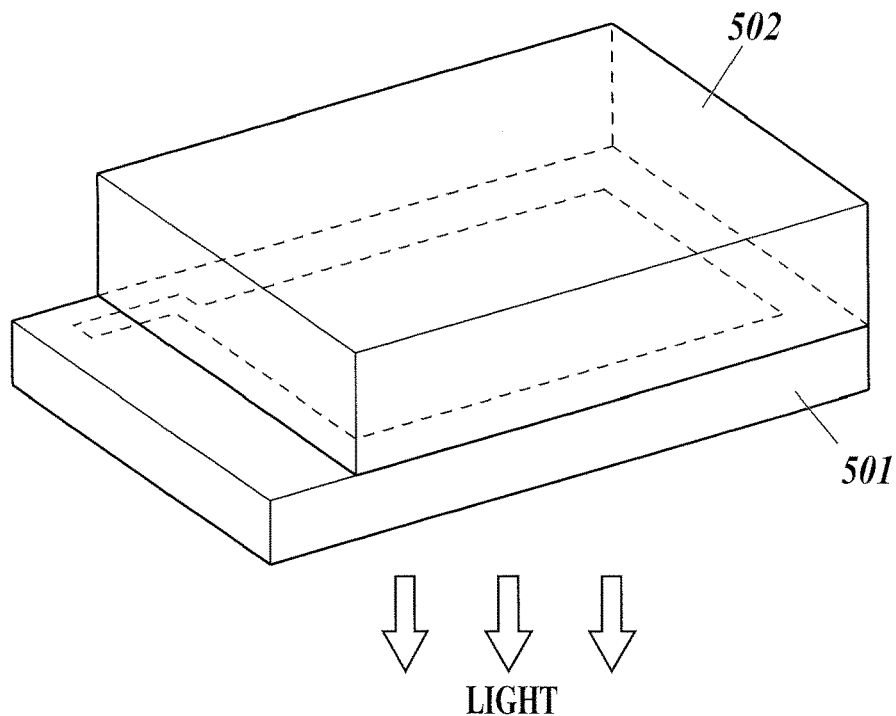
FIG. 6A is a perspective view illustrating a schematic configuration of an organic EL panel.

Eventually, the deposition side of the organic EL element is covered with a glass case within a globe box in a nitrogen atmosphere (in an atmosphere of high-purity nitrogen gas with a purity of 99.999% or higher) to produce the organic EL panels 1-1 and 2-1 as illustrated in FIG. 6A.

Figure 6B:
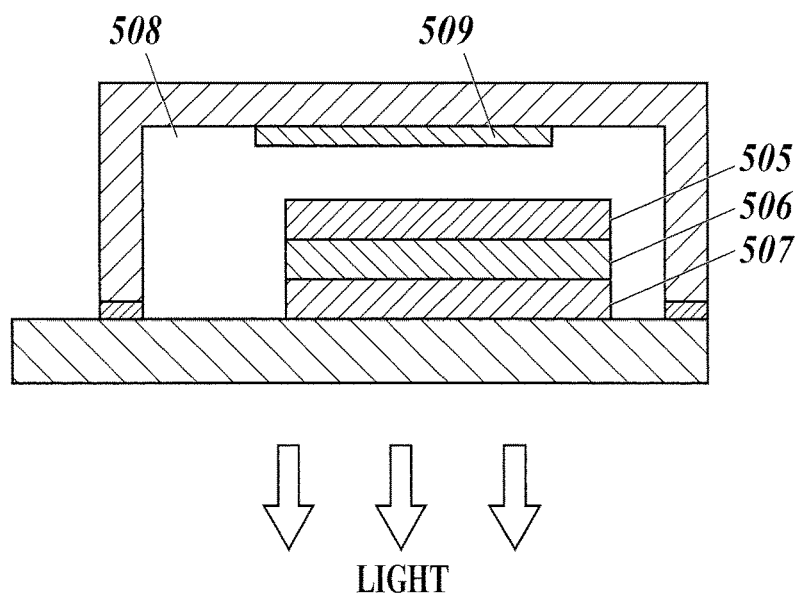
FIG. 6B is a cross-sectional view illustrating the schematic configuration of the organic EL panel.
Figure 7:
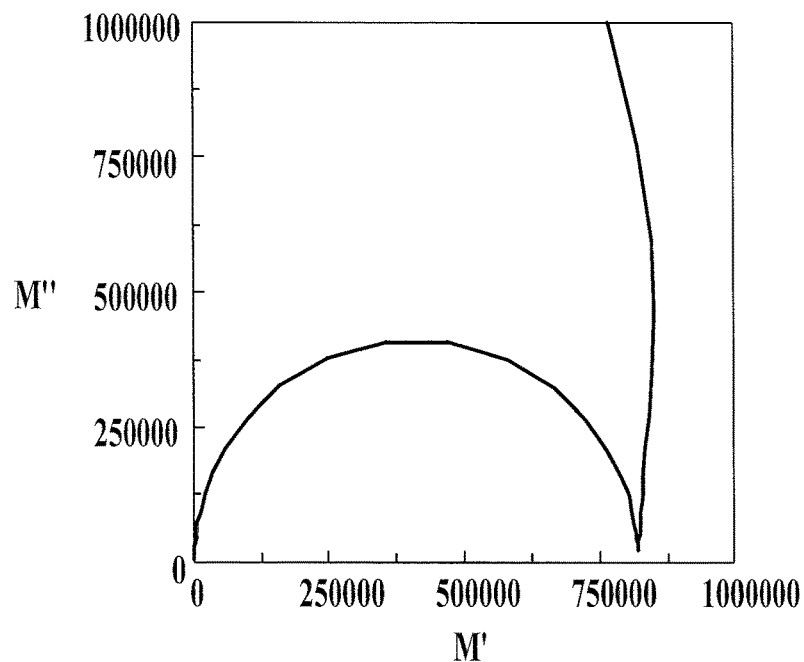
FIG. 7 is a diagram schematically showing an M plot of an organic EL panel 1-1.
Figure 8:
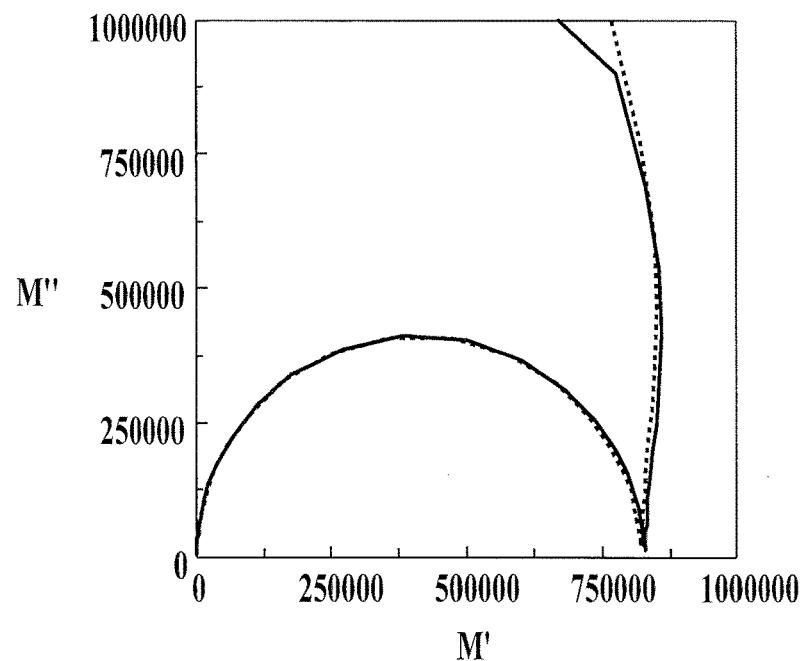
FIG. 8 is a diagram schematically showing an M plot of an organic EL panel 1-2.
Figure 9:
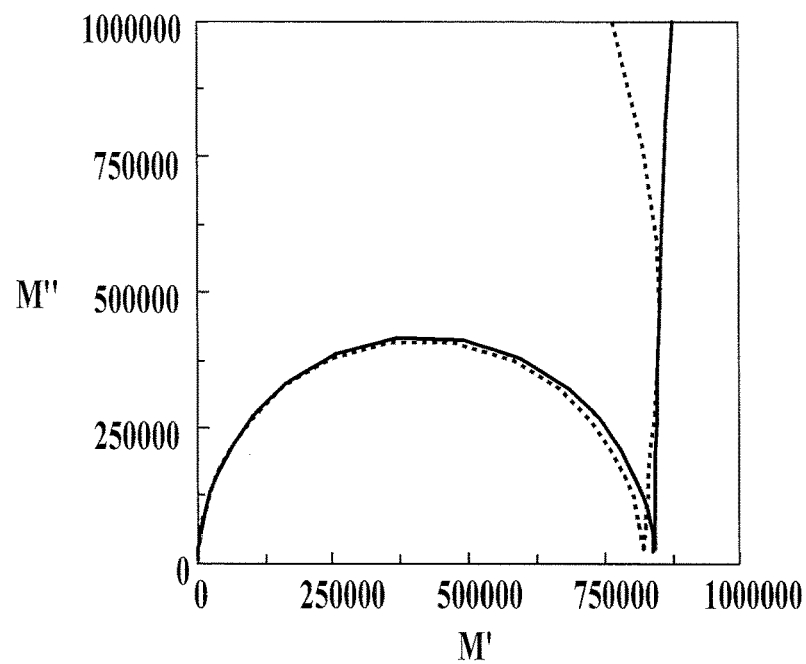
FIG. 9 is a diagram schematically showing an M plot of an organic EL panel 1-3.
Figure 10:
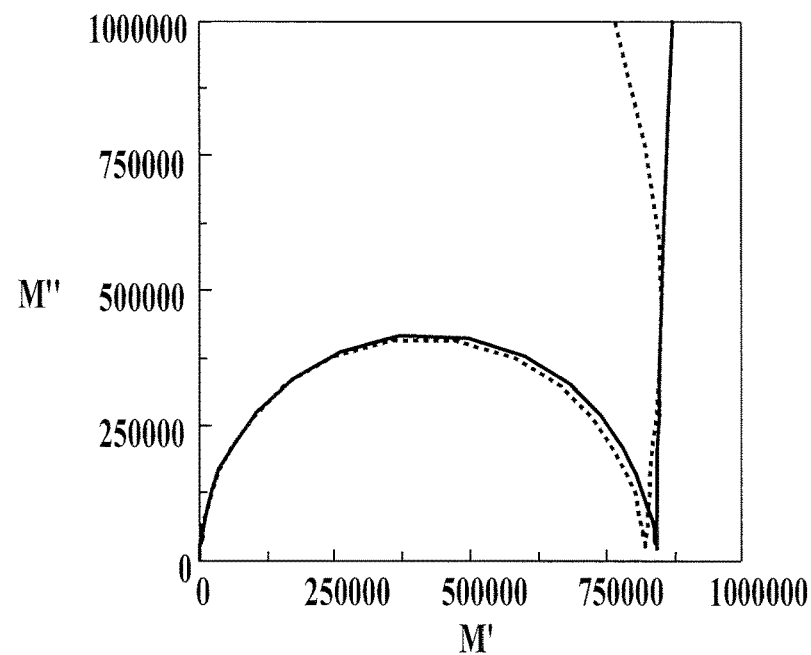
FIG. 10 is a diagram schematically showing an M plot of an organic EL panel 1-4.
Figure 11:
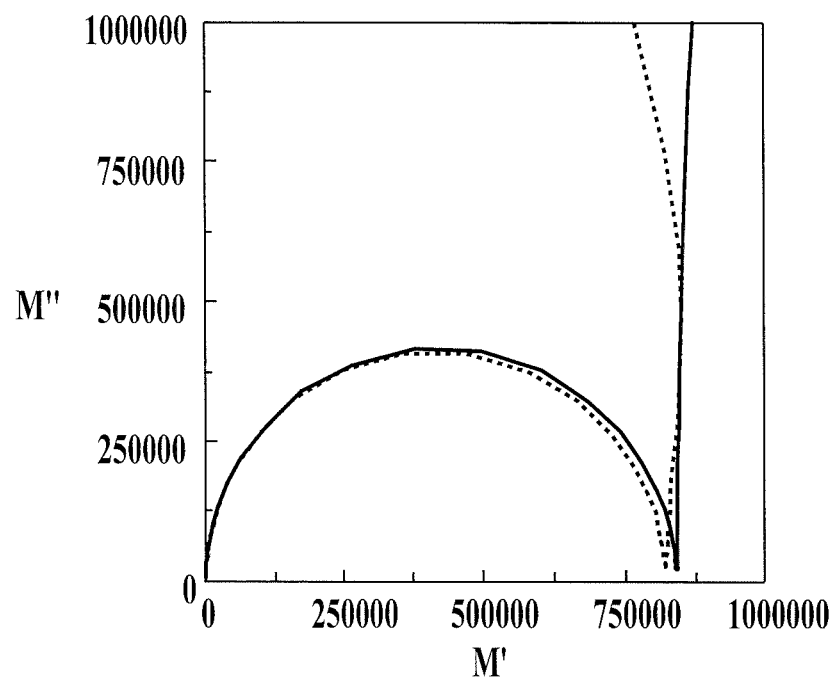
FIG. 11 is a diagram schematically showing an M plot of an organic EL panel 1-5.
Figure 12:
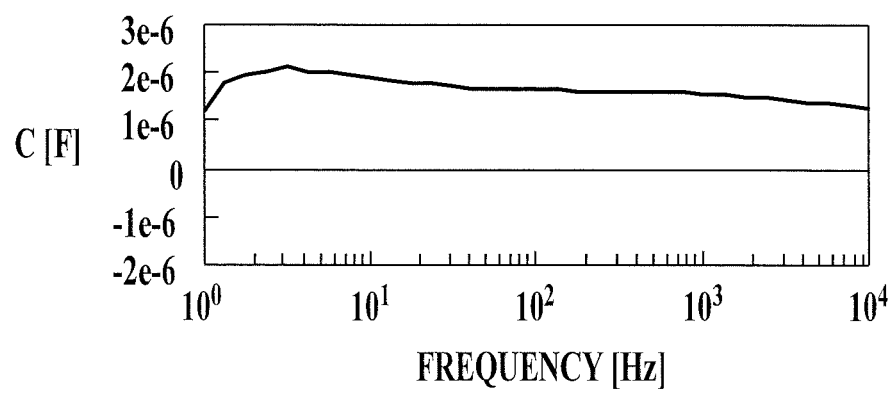
FIG. 12 is a diagram schematically showing a capacitance-frequency plot (C-F plot) of an organic EL panel 2-1.
Figure 13:
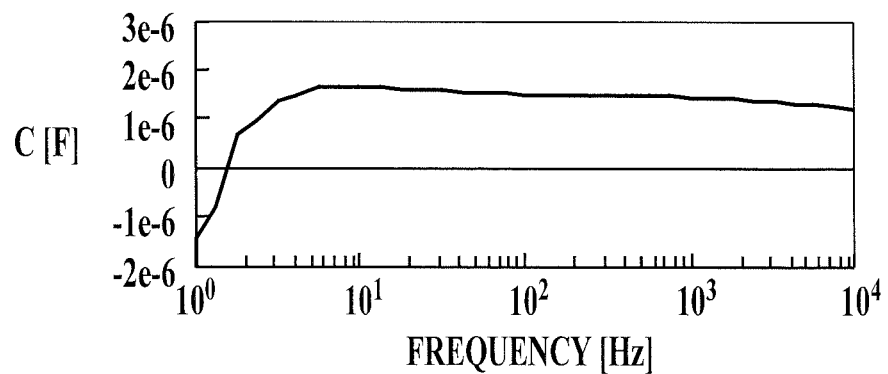
FIG. 13 is a diagram schematically showing a C-F plot of an organic EL panel 2-2.
Figure 14:
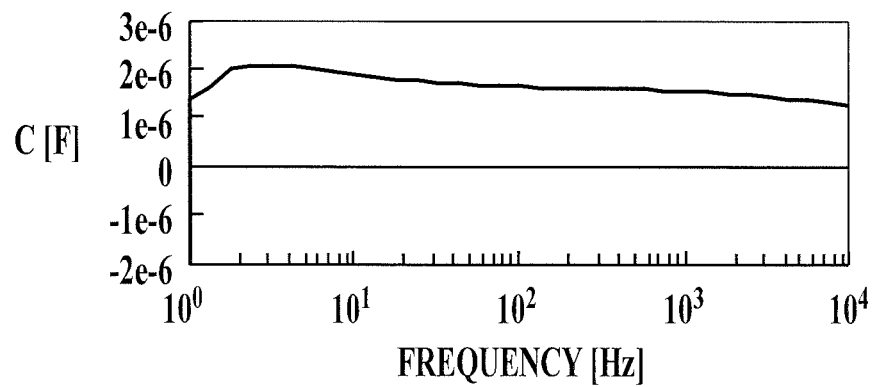
FIG. 14 is a diagram schematically showing a C-F plot of an organic EL panel 2-3.
Figure 15:
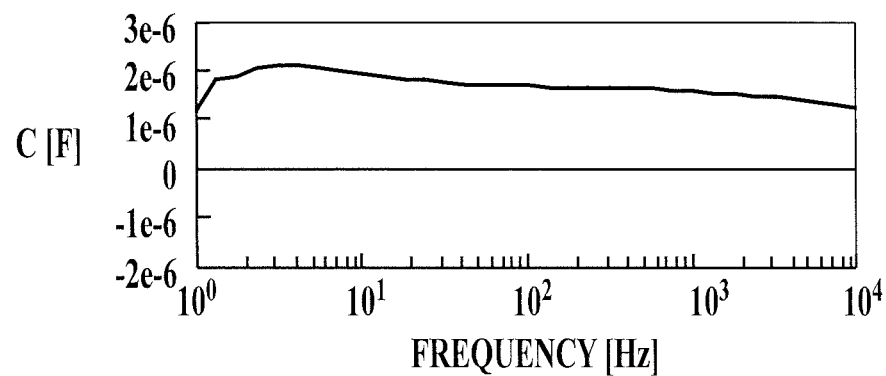
FIG. 15 is a diagram schematically showing a C-F plot of an organic EL panel 2-4.
Figure 16:
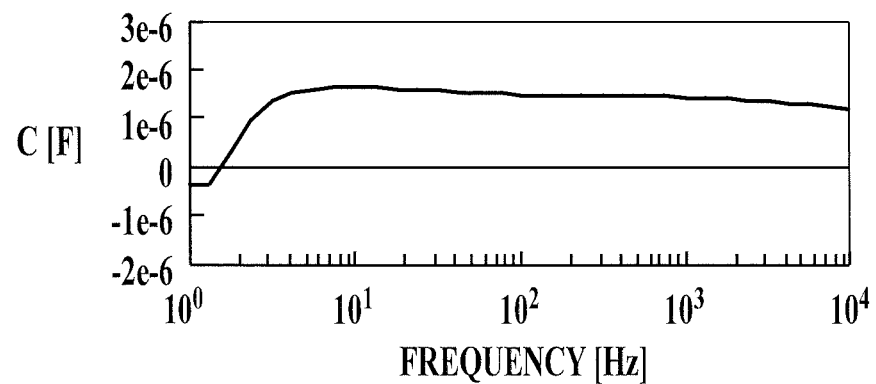
FIG. 16 is a diagram schematically showing a C-F plot of an organic EL panel 2-5.
Figure 17:
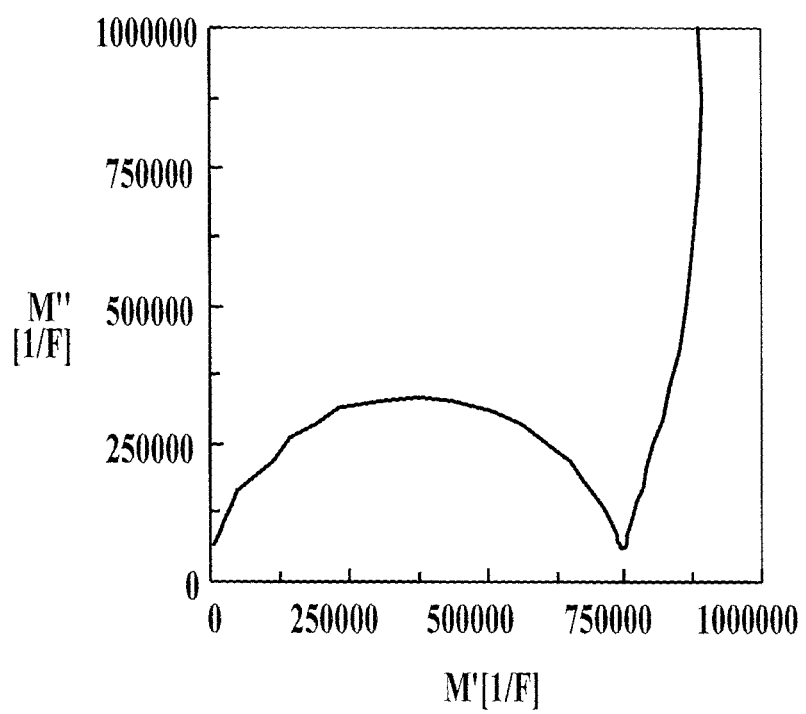
FIG. 17 is a diagram schematically showing an M plot of a large-area organic EL element.

As illustrated in FIG. 6B, an organic layer 506 and a cathode 505 are formed on a glass substrate 507 with a transparent electrode. The inside of the glass cover 502 is filled with nitrogen gas 508, and desiccant (a water collecting agent) 509 is provided therein.

(1-2) Preparation of Organic EL panels 1-2 to 1-5, 2-2 to 2-5

Two panels are simultaneously prepared in a similar manner to the organic EL panels 1-1 and 2-1.

The manufacturing conditions thereof are as follows.

TABLE 1

| SAMPLE NO. | PREPARATION DATE | DATE OF VAPOR DEPOSITION PROCESS |
| --- | --- | --- |
| 1-1 | 1 | 1 |
| 2-1 | | |
| 1-2 | 2 | 1 |
| 2-2 | | |
| 1-3 | 2 | 2 |

TABLE 1-continued

| SAMPLE NO. | PREPARATION DATE | DATE OF VAPOR DEPOSITION PROCESS |
| --- | --- | --- |
| 2-3 | | |
| 1-4 | 3 | 1 |
| 2-4 | | |
| 1-5 | 3 | 3 |
| 2-5 | | |

(2) Evaluation of Organic EL panels 1-1 to 1-5

(2-1) Initial Performance Evaluation

The light emission luminance of the organic EL panels 1-1 to 1-5 is measured by the evaluation method described in Patent Literature 1. Specifically, the light emission luminance ($cd/m^2$) at the time of applying a DC voltage of 10 V thereto is measured. The light emission luminance is represented by relative values to the light emission luminance of the organic EL panel 1-1, which is set to 100.

The light emission luminance is measured using Spectroradiometer CS1000 (by Konica Minolta Sensing).

The results thereof are shown in Table 2.

(2-2) Time Period of Falling from Initial State

The time period taken for the light emission luminance to become 90% of the initial luminance after each prepared organic EL panel is driven by constant current with a current density of 10 $mA/cm^2$ (=time period for the luminance to fall from the initial luminance by 10%) is measured and is shown by a relative value to that of the organic EL panel 1-1, which is set to 100.

The light emission luminance is measured by Spectroradiometer CS1000 (by Konica Minolta Sensing).

The results thereof are shown in Table 2.

TABLE 2

| SAMPLE NO. | AREA OF LIGHT EMITTING ELEMENT [mm$^2$] | NUMBER OF LAYERS | NUMBER OF SEMICIRCLES | LIGHT EMITTING LUMINANCE | TIME PERIOD OF FALLING FROM INITIAL STATE |
|---|---|---|---|---|---|
| 1-1 | 100 | 9 | 1 | 100 | 100 |
| 1-2 | 100 | 9 | 1 | 97 | 73 |
| 1-3 | 100 | 9 | 1 | 103 | 103 |
| 1-4 | 100 | 9 | 1 | 102 | 101 |
| 1-5 | 100 | 9 | 1 | 99 | 75 |

(2.3) Measurement of M Plot by IS Method

M plots of the organic EL panels 1-1 to 1-5 are formed by the IS method.

The measurement by the IS method is performed using Impedance analyzer 1260 and Dielectric interface 1296 by Solartron. The applied voltage is DC bias plus AC 100 mV, and the frequency range is set to 0.1 mHz to 1 MHz. The equivalent circuit analysis is performed using ZView by Scribner Associates.

The results thereof are shown in FIGS. 7 to 11.

In FIGS. 8 to 11, graphs indicated by dotted lines are M plots of the organic EL panel 1-1.

As shown in FIGS. 7 to 11, by the evaluation method (M plots) described in Patent Literature 2, all the organic EL panels have no difference between the M plot profiles and are determined to be non-defective, and the organic EL panels 1-2 and 1-5, whose time periods of falling from initial state are considerably short, cannot be identified. It is therefore confirmed that the evaluation method (M plot) is not adequate for evaluation of large-area devices.

(3) Evaluation of Organic EL Panels 2-1 to 2-5

(3.1) Initial Performance Evaluation

For each of the organic EL panels 2-1 to 2-5, the current value and light emission luminance are measured by Spectroradiometer CS1000 (Konica Minolta Sensing) as the applied voltage is increased by 0.5 volt from 1 to 10 volt using a DC power supply.

Furthermore, the light emission luminance (cd/m$^2$) obtained when DC voltage of 10 volt is applied is measured and is shown by a relative value to that of the organic EL panel 2-1, which is set to 100.

The results thereof are shown in Table 3.

(3.2) Driving Lifetime Evaluation

The organic EL panels 2-1 to 2-5 are continuously driven as DC current having a current density that gives a front luminance 1000 cd/m$^2$ as the initial luminance is applied thereto. The change in luminance thereof is then traced, and time t which is taken for the luminance to be reduced to 50% is evaluated as a half-luminance lifetime. The half-luminance lifetime is shown by a relative value to that of the organic EL panel 2-1, which is set to 100 (a reference). An organic EL panel having a half-luminance lifetime shorter than the reference by 20% or more is evaluated as a defective.

The results thereof are shown in Table 3.

TABLE 3

| SAMPLE NO. | AREA OF LIGHT EMITTING ELEMENT [mm$^2$] | NEGATIVE CAPACITANCE | LUMINANCE EFFICIENCY | LIFE TIME | EVALUATION |
|---|---|---|---|---|---|
| 2-1 | 100 | ABSENT | 100 | 100 | NON-DEFECTIVE |
| 2-2 | 100 | PRESENT | 98 | 69 | DEFECTIVE |
| 2-3 | 100 | ABSENT | 101 | 104 | NON-DEFECTIVE |
| 2-4 | 100 | ABSENT | 103 | 103 | NON-DEFECTIVE |
| 2-5 | 100 | PRESENT | 99 | 71 | DEFECTIVE |

(3.3) Measurement of C-F Plot by IS Method

C-F plots of the organic EL panels 2-1 to 2-5 are formed by the IS method.

The measurement by the IS method is performed using Impedance analyzer 1260 and Potentiostat 1287 of Solartron. As for the applied voltage, based on the results of the aforementioned initial performance evaluation, a voltage that gives a luminance of 100 cd/m$^2$ is applied as the DC bias, and AC 100 mV is further applied. The frequency range is set to 1 Hz to 100 kHz. The equivalent circuit analysis is performed using ZView of Scribner Associates.

The results thereof are shown in FIGS. 12 to 16.

As shown in Table 3 and FIGS. 12 to 16, the evaluation method using C-F plots reveals a difference in profile between the C-F plots. This makes it possible to confirm whether the lifetime of an organic EL panel is short or long, which cannot be detected by M plots. Accordingly, it is revealed that the evaluation method using C-F plots can predict the lifetime before the organic EL panel is deteriorated.

Example 2

(1) Preparation of Samples (1.1) Preparation of Organic EL panel 3-1

As an anode, ITO is formed into 100 nm thick film on a 100 mm×100 mm glass substrate with a thickness of 1.1 mm, and the obtained product is masked and patterned so that the ITO area is 50 mm×50 mm. The substrate with the ITO transparent electrode provided thereon are ultrasonically cleaned with isopropyl alcohol, dried with dry nitrogen gas, and subjected to UV ozone cleaning for five minutes.

On the thus-obtained transparent supporting substrate, a solution of 70% poly(3,4-ethylenedioxythiophene)-polystyrene sulfonate (PEDOT/PSS, made by Bayer, Baytron P AI 4083) diluted with pure water is formed into film by spin coating at 3000 rpm for 30 seconds and is dried at 180° C. for 30 minutes, thus providing a 30 nm thick hole injection layer.

The thus-obtained substrate is moved into nitrogen atmosphere, in which a solution of 20 mg compound 4-16 dissolved in 4 ml toluene is formed into film by spin coating at 1500 rpm for 30 seconds and is then dried at 80° C. for 30 minutes. Next, the resultant substrate is irradiated by a UV lamp with an output of 35 mW/cm$^2$ for 30 seconds for polymerization and cross-linking, thus providing a 20 nm thick hole transport layer.

Furthermore, a light emitting layer composite including H-A (87.5 parts by mass), Ir-A (12.0 parts by mass), Ir-1 (0.25 parts by mass), Ir-14 (0.25 parts by mass), and toluene (8000 parts by mass) is formed into film by spin coating at 1500 rpm for 30 seconds and is then dried at 80° C. for 30 minutes, thus providing a 50 nm thick light emitting layer.

Subsequently, the substrate is attached to the vacuum deposition device without being exposed to air. Moreover, molybdenum resistance heating boats individually including ET-A and CsF are attached to the vacuum deposition device. The vacuum chamber is reduced in pressure to 4×10$^{-4}$ Pa, and then the boats are supplied with electricity to be heated. ET-A and CsF are co-deposited on the light emitting layer at deposition rates of 0.2 nm/sec and 0.03 nm/sec, respectively, thus providing a 20 nm thick electron transport layer.

Subsequently, aluminum is deposited to be 110 nm to form a cathode, thus preparing a white light emitting organic EL element having a light emitting element area of 50 mm×50 mm.

Eventually, using the white light emitting organic EL element, the organic EL panel 3-1 is prepared in a similar manner to Example 1.

[Compound 7]

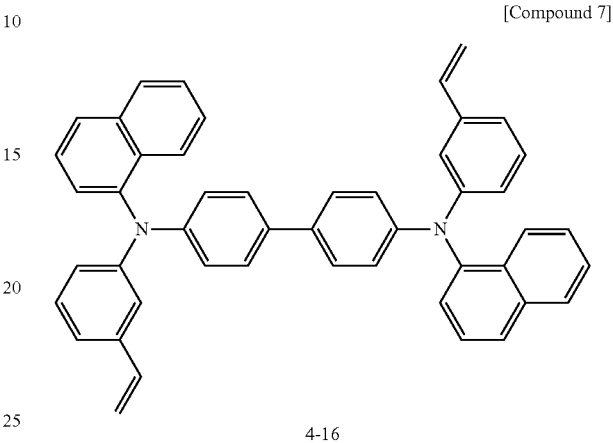

4-16

[Compound 8]

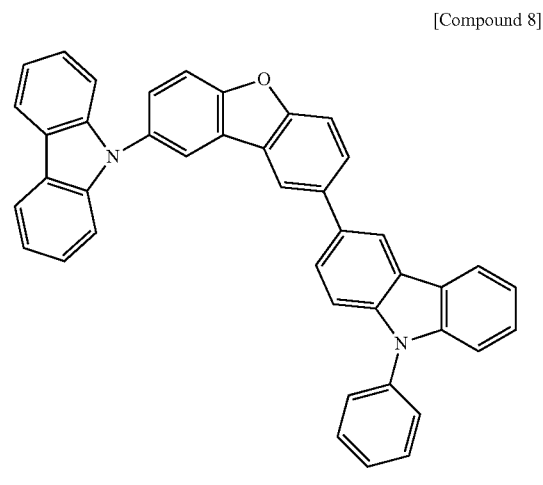

H-A

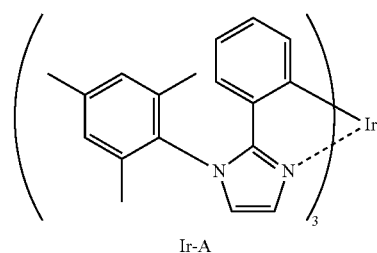

Ir-A

-continued

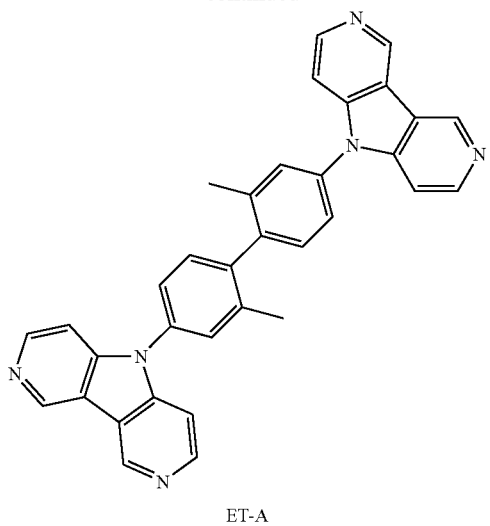

ET-A (1.2) Preparation of Organic EL Panels 3-2 to 3-5

Organic EL panels 3-2 to 3-5 are prepared in a similar manner to the organic EL panel 3-1.

The manufacturing conditions thereof are set as follows.

TABLE 4

| SAMPLE NO. | PREPARATION DATE | DATE OF WET PROCESS |
|---|---|---|
| 3-1 | 1 | 1 |
| 3-2 | 2 | 1 |
| 3-3 | 2 | 2 |
| 3-4 | 3 | 1 |
| 3-5 | 3 | 3 |

(2) Evaluation of Organic EL Panels 3-2 to 3-5

(2.1) Initial Performance Evaluation

For each of the organic EL panels 3-1 to 3-5, the current value and light emission luminance are measured by Spectroradiometer CS1000 (Konica Minolta Sensing) as the applied voltage is increased by 0.5 volt from 1 to 10 volt using a DC power supply.

Furthermore, the light emission luminance ($cd/m^2$) obtained when DC voltage of 10 volt is applied to the same is measured and is represented by a relative value to the light emission luminance of the organic EL panel 2-1, which is set to 100.

The results thereof are shown in Table 5.

(2.2) Driving Lifetime Evaluation

The organic EL panels 3-1 to 3-5 are continuously driven as DC current having such a current density that gives a front luminance 1000 $cd/m^2$ as the initial luminance is applied thereto. The change in luminance thereof is then traced, and time t which is taken for the luminance to be reduced to 50% is evaluated as a half-luminance lifetime. The half-luminance lifetime is represented by a relative value to that of the organic EL panel 2-1, which is set to 100 (a reference). An organic EL panel having a half-luminance lifetime shorter than the reference by 20% or more is evaluated as a defective.

The results thereof are shown in Table 5.

(2.3) Measurement of C-F Plot by IS Method

C-F plots of the organic EL panels 3-1 to 3-5 are formed by the IS method.

The measurement by IS method is performed using Impedance analyzer 1260 and Potentiostat 1287 by Solartron. As for the applied voltage, based on the results of the aforementioned initial performance evaluation, a voltage that gives a luminance of 100 $cd/m^2$ is applied as the DC bias, and AC of 100 mV is further applied. The frequency range is set to 1 Hz to 100 kHz. The equivalent circuit analysis is performed using ZView of Scribner Associates. The presence/absence of the negative capacitance is determined from the C-F plots.

The results thereof are shown in Table 5.

TABLE 5

| SAMPLE NO. | AREA OF LIGHT EMITTING ELEMENT [$mm^2$] | NEGATIVE CAPACITANCE | LUMINANCE EFFICIENCY | LIFE TIME | EVALUATION |
|---|---|---|---|---|---|
| 3-1 | 2500 | ABSENT | 100 | 100 | NON-DEFECTIVE |
| 3-2 | 2500 | ABSENT | 99 | 103 | NON-DEFECTIVE |
| 3-3 | 2500 | ABSENT | 103 | 98 | NON-DEFECTIVE |
| 3-4 | 2500 | PRESENT | 103 | 68 | DEFECTIVE |
| 3-5 | 2500 | PRESENT | 98 | 61 | DEFECTIVE |

As shown in Table 5, it is revealed that even if an organic EL element is made of different materials, the length of the lifetime of the organic EL element can be predicted depending on whether the capacitance is positive or negative in the measurement frequency range.

Example 3

(1) Preparation of Organic EL Panels 4-1 to 4-5

Organic EL panels 4-1 to 4-5 are prepared in the same way as Example 2 excepting that the glass substrate has a size of 250 mm×250 mm and a thickness of 1.1 mm and the light emitting element area is changed to 200 mm×200 mm.

(2) Evaluation of Organic EL Panels 4-1 to 4-5

(2.1) Initial Performance Evaluation

The initial performance is evaluated in a similar manner to Example 2.

The results thereof are shown in Table 6.

The initial performance evaluation is represented by relative values to that of the organic EL panels 4-1, which is set to 100.

(2.2) Driving Lifetime Evaluation

The driving lifetime evaluation is performed in a similar manner to Example 2.

The results thereof are shown in FIG. 6.

The half-luminance lifetime is represented by relative values to the organic EL panel 4-1, which is set to 100 (a reference).

(2.3) Measurement of C-F Plot by IS Method

C-F plots of the organic EL panels 4-1 to 4-5 are created by the IS method.

The measurement by the IS method is performed using Impedance analyzer 1260 and Potentiostat 1287 by Solartron. As for the applied voltage, from the results of the aforementioned initial performance evaluation, a voltage that gives a luminance of 1000 cd/m$^2$ is applied as the DC bias, and AC of 100 mV is further applied thereto. The frequency range is set to 1 Hz to 100 kHz. The equivalent circuit analysis is performed using ZView by Scribner Associates. The threshold frequency at which the capacitance changes from a positive value to a negative value is obtained from the C-F plot.

The results thereof are shown in Table 6.

TABLE 6

| SAMPLE NO. | AREA OF LIGHT EMITTING ELEMENT [mm$^2$] | THRESHOLD FREQUENCY [Hz] | LUMINANCE EFFICIENCY | LIFE TIME | EVALUATION |
| --- | --- | --- | --- | --- | --- |
| 4-1 | 40000 | 230 | 100 | 100 | NON-DEFECTIVE |
| 4-2 | 40000 | 670 | 99 | 59 | DEFECTIVE |
| 4-3 | 40000 | 650 | 101 | 65 | DEFECTIVE |
| 4-4 | 40000 | 210 | 100 | 101 | NON-DEFECTIVE |
| 4-5 | 40000 | 220 | 103 | 102 | NON-DEFECTIVE |

As illustrated in Table 6, it is revealed that even if the negative capacitance is observed, it can be predicted whether the lifetime of a large-area organic EL panel is long or short before the panel is deteriorated when the threshold frequency satisfies the predetermined conditions (<400 Hz=0.01×40000).

INDUSTRIAL APPLICABILITY

The present invention is preferably applicable to strict evaluation of the device performances of large-area organic electroluminescence element, especially, the durability.

EXPLANATION OF REFERENCE NUMERALS

1 IMPEDANCE SPECTRUM MEASUREMENT SYSTEM
10 CONTROL SECTION
12 CPU
14 RAM
20 MEASUREMENT SECTION
22 IMPEDANCE ANALYZER
24 POTENTIOSTAT
30 STORAGE SECTION
32 ROM
40 INPUT SECTION
50 OUTPUT SECTION
501 ORGANIC EL ELEMENT
502 GLASS COVER
505 CATHODE
506 ORGANIC LAYER
507 GLASS SUBSTRATE WITH TRANSPARENT ELECTRODE
508 NITROGEN GAS
509 DESICCANT
P1, P2 EVALUATION PROGRAM
C1, C2 CURVE

The invention claimed is:

1. A method of evaluating an organic electroluminescence element which includes at least a light emitting layer between an anode and a cathode and has a light emitting element area of not less than 100 mm$^2$ and not more than 1 m$^2$, the method comprising the steps of:
applying a direct-current voltage greater than a light emission start voltage to the organic electroluminescence element and measuring an impedance spectrum of the organic electroluminescence element;
calculating a capacitance from a frequency of the impedance spectrum;
determining whether a value of the capacitance is positive or negative;
determining whether the organic electroluminescence element is defective based on whether the value of the capacitance is positive or negative; and
outputting, to a display for viewing by a user, a result of whether the organic electroluminescence element is defective.

2. The method of evaluating the organic electroluminescence element of claim 1, wherein in the step of measuring the impedance spectrum, a frequency range of measurement of the impedance spectrum is set to a range from 1 Hz to 10 kHz, and the direct-current voltage having such a magnitude that the organic electroluminescence element has a luminance of 1 to 500 cd/m$^2$ is applied.

3. The method of evaluating the organic electroluminescence element of claim 1, wherein:
in the step of measuring the impedance spectrum, a frequency range of measurement of the impedance spectrum is set to a range from 1 Hz to 10 kHz, and direct-current voltage having such a magnitude that the organic electroluminescence element has a luminance of 10 to 5000 cd/m$^2$ is applied,
in the step of determining whether the value of the capacitance is positive or negative, when it is determined that the value of the capacitance is negative, it is further determined whether a magnitude of a threshold frequency $f_{th}$ compared to a magnitude of a light emitting element area (mm$^2$) satisfies the condition by Formula (1)

$$f_{th}(\text{Hz}) < 0.01 \times A \quad (1)$$

wherein $f_{th}$ is a threshold frequency and A is the light emitting element area (mm$^2$), the threshold frequency $f_{th}$ being a measurement frequency which constitutes a boundary between positive and negative of the value of the capacitance.

4. An evaluation device for an organic electroluminescence element which includes at least a light emitting layer between an anode and a cathode and has a light emitting element area of not less than 100 mm² and not more than 1 m², the device comprising:

a measurement section that applies a direct-current voltage not less than a light emission start voltage to the organic electroluminescence element and to measure an impedance spectrum of the organic electroluminescence element; and a control section that:
calculates a capacitance from a frequency of the impedance spectrum;
determines whether a value of the capacitance is positive or negative;
determines whether the organic electroluminescence element is defective based on whether the value of the capacitance is positive or negative; and
outputs a result of whether the organic electroluminescence element is defective on a display for viewing by a user.

5. The evaluation device for the organic electroluminescence element of claim 4, wherein the measurement section sets a frequency range of measurement of the impedance spectrum to a range from 1 Hz to 10 kHz, and applies the direct-current voltage having such a magnitude that the organic electroluminescence element has a luminance of 1 to 500 cd/m².

6. The evaluation device for the organic electroluminescence element of claim 4, wherein:

the measurement section sets a frequency range of measurement of the impedance spectrum to a range from 1 Hz to 10 kHz, and applies the direct-current voltage having such a magnitude that the organic electroluminescence element has a luminance of 10 to 5000 cd/m², and when the control section determines that the value of the capacitance is negative, the control section further determines whether a magnitude of a threshold frequency $f_{th}$ compared to a magnitude of a light emitting element area (mm²) satisfies the condition by Formula (1)

$$f_{th}(\text{Hz}) < 0.01 \times A \qquad (1)$$

wherein $f_{th}$ is a threshold frequency and A is the light emitting element area (mm²), the threshold frequency $f_{th}$ being a measurement frequency which constitutes a boundary between positive and negative of the value of the capacitance.

* * * * *